(12) United States Patent
Fukuzumi et al.

(10) Patent No.: US 8,334,561 B2
(45) Date of Patent: *Dec. 18, 2012

(54) NONVOLATILE SEMICONDUCTOR MEMORY DEVICE AND METHOD OF MANUFACTURING THE SAME

(75) Inventors: Yoshiaki Fukuzumi, Yokohama (JP);
Ryota Katsumata, Yokohama (JP);
Masaru Kito, Yokohama (JP); Masaru Kidoh, Komae (JP); Hiroyasu Tanaka, Yokohama (JP); Megumi Ishiduki, Yokohama (JP); Yosuke Komori, Yokohama (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 204 days.

This patent is subject to a terminal disclaimer.

(21) Appl. No.: 12/709,702

(22) Filed: Feb. 22, 2010

(65) Prior Publication Data
US 2010/0213538 A1    Aug. 26, 2010

(30) Foreign Application Priority Data
Feb. 25, 2009    (JP) ................................. 2009-042754

(51) Int. Cl.
*H01L 29/72* (2006.01)
(52) U.S. Cl. .......................... 257/326; 257/324; 257/616
(58) Field of Classification Search .................. 257/324, 257/326, 616
See application file for complete search history.

(56) References Cited

U.S. PATENT DOCUMENTS

| 2007/0252201 A1 | 11/2007 | Kito et al. |
| 2009/0146206 A1 | 6/2009 | Fukuzumi et al. |
| 2009/0224309 A1 | 9/2009 | Kidoh et al. |
| 2009/0294844 A1 | 12/2009 | Tanaka et al. |
| 2010/0163968 A1* | 7/2010 | Kim et al. ..................... 257/324 |

FOREIGN PATENT DOCUMENTS

| JP | 2007-266143 | 10/2007 |
| WO | WO 2009/075370 A1 | 6/2009 |

OTHER PUBLICATIONS

U.S. Appl. No. 13/227,882, filed Sep. 8, 2011, Mizushima, et al.
U.S. Appl. No. 12/886,135, filed Sep. 20, 2010, Mizushima, et al.
U.S. Appl. No. 12/679,991, filed Mar. 25, 2010, Fukuzumi, et al.
U.S. Appl. No. 13/415,057, filed Mar. 8, 2012, Higuchi.
U.S. Appl. No. 13/414,988, filed Mar. 8, 2012, Fujiki, et al.
U.S. Appl. No. 13/422,068, filed Mar. 16, 2012, Ichinose, et al.

* cited by examiner

*Primary Examiner* — Edward Wojciechowicz
(74) *Attorney, Agent, or Firm* — Oblon, Spivak, McClelland, Maier & Neustadt, L.L.P.

(57) ABSTRACT

A memory string comprises: a first semiconductor layer having a plurality of columnar portions extending in a perpendicular direction with respect to a substrate, and joining portions joining lower ends of the plurality of columnar portions; a charge storage layer surrounding a side surface of the first semiconductor layer; and a first conductive layer surrounding a side surface of the charge storage layer and functioning as a control electrode of memory cells. A select transistor comprises: a second semiconductor layer extending upwardly from an upper surface of the columnar portions; an insulating layer surrounding a side surface of the second semiconductor layer; a second conductive layer surrounding a side surface of the insulating layer and functioning as a control electrode of the select transistors; and a third semiconductor layer formed on an upper surface of the second semiconductor layer and including silicon germanium.

12 Claims, 27 Drawing Sheets

NONVOLATILE SEMICONDUCTOR MEMORY DEVICE AND METHOD OF MANUFACTURING THE SAME

CROSS REFERENCE TO RELATED APPLICATIONS

This application is based upon and claims the benefit of priority from the prior Japanese Patent Application No. 2009-42754, filed on Feb. 25, 2009, the entire contents of which are incorporated herein by reference.

BACKGROUND OF THE INVENTION

1. Field of the Invention

The present invention relates to an electrically data-rewritable nonvolatile semiconductor memory device and a method of manufacturing the same.

2. Description of the Related Art

Conventionally, an LSI is formed by integrating elements in a two-dimensional plane on a silicon substrate. It is common practice to increase a storage capacity of memory by reducing dimensions of (miniaturizing) an element. However, in recent years, even this miniaturization is becoming difficult in terms of cost and technology. Improvements in photolithographic technology are necessary for miniaturization, but costs required for lithographic processes are steadily increasing. Moreover, even if miniaturization is achieved, it is expected that physical limitations such as those of withstand voltage between elements are encountered, unless the drive voltage and so on are scaled. In other words, there is a high possibility that operation as a device becomes difficult.

Accordingly, in recent years, there is proposed a semiconductor memory device in which memory cells are disposed three-dimensionally in order to increase a degree of integration of memory (refer to patent document 1: Japanese Unexamined Patent Application Publication No. 2007-266143).

One conventional semiconductor memory device in which memory cells are disposed three-dimensionally uses transistors with a cylindrical column-shaped structure (patent document 1). The semiconductor memory device using the transistors with the cylindrical column-shaped structure is provided with multi-layer conductive layers configured to form gate electrodes, and pillar-shaped columnar semiconductor layers. The columnar semiconductor layer functions as a channel (body) portion of the transistors. A vicinity of the columnar semiconductor layer is provided with a memory gate insulating layer. A configuration including these conductive layer, columnar semiconductor layer, and memory gate insulating layer is called a memory string.

The above-described columnar semiconductor layer is constituted by polysilicon and formed from amorphous silicon by subjecting the amorphous silicon to crystallization heat treatment. However, the crystals thus formed easily become minute and increase a cell current value, thereby hindering realization of a speeding up of the memory.

SUMMARY OF THE INVENTION

In accordance with a first aspect of the present invention, a nonvolatile semiconductor memory device, comprising: a plurality of memory strings each having a plurality of electrically rewritable memory cells connected in series; and select transistors each connected to one of the ends of the memory strings, each of the memory strings comprising: a first semiconductor layer having a plurality of columnar portions extending in a perpendicular direction with respect to a substrate, and joining portions joining lower ends of the plurality of columnar portions; a charge storage layer surrounding a side surface of the first semiconductor layer; and a first conductive layer surrounding a side surface of the charge storage layer and functioning as a control electrode of the memory cells, and each of the select transistors comprising: a second semiconductor layer extending upwardly from an upper surface of the columnar portions; an insulating layer surrounding a side surface of the second semiconductor layer; a second conductive layer surrounding a side surface of the insulating layer and functioning as a control electrode of the select transistors; and a third semiconductor layer formed on an upper surface of the second semiconductor layer and including silicon germanium.

In accordance with a second aspect of the present invention, a nonvolatile semiconductor memory device, comprising: a plurality of memory strings each having a plurality of electrically rewritable memory cells connected in series; and select transistors each connected to one of the ends of the memory strings, each of the select transistors comprising: a second semiconductor layer extending upwardly; an insulating layer surrounding a side surface of the second semiconductor layer; a second conductive layer surrounding a side surface of the insulating layer and functioning as a control electrode of the select transistors; and a third semiconductor layer formed on an upper surface of the second semiconductor layer and including silicon germanium, the third semiconductor layer being positioned in a higher layer than an upper surface of the second conductive layer.

In accordance with a third aspect of the present invention, a method of manufacturing a nonvolatile semiconductor memory device, the nonvolatile semiconductor memory device including a plurality of memory strings each having a plurality of electrically rewritable memory cells connected in series, and select transistors each connected to one of the ends of the memory strings, comprising: depositing a plurality of first conductive layers sandwiched by first interlayer insulating layers; depositing on an upper layer of the first conductive layers a second conductive layer sandwiched by second interlayer insulating layers; penetrating the plurality of first conductive layers, the first interlayer insulating layers, the second conductive layer, and the second interlayer insulating layers in a U-shape as viewed from a direction parallel to a substrate to form a hole; forming a charge storage layer on a side surface of the plurality of first conductive layers facing the hole; forming an insulating layer on a side surface of the second conductive layer facing the hole; forming a first semiconductor layer so as to fill the hole; forming a second semiconductor layer including silicon germanium on an upper surface of the first semiconductor layer; and crystallizing the first semiconductor layer and the second semiconductor layer.

DETAILED DESCRIPTION OF THE EMBODIMENTS

Embodiments of a nonvolatile semiconductor memory device in accordance with the present invention are described below with reference to the drawings.

[First Embodiment]

(Configuration of a Nonvolatile Semiconductor Memory Device 100 in Accordance with a First Embodiment)

Figure 1:
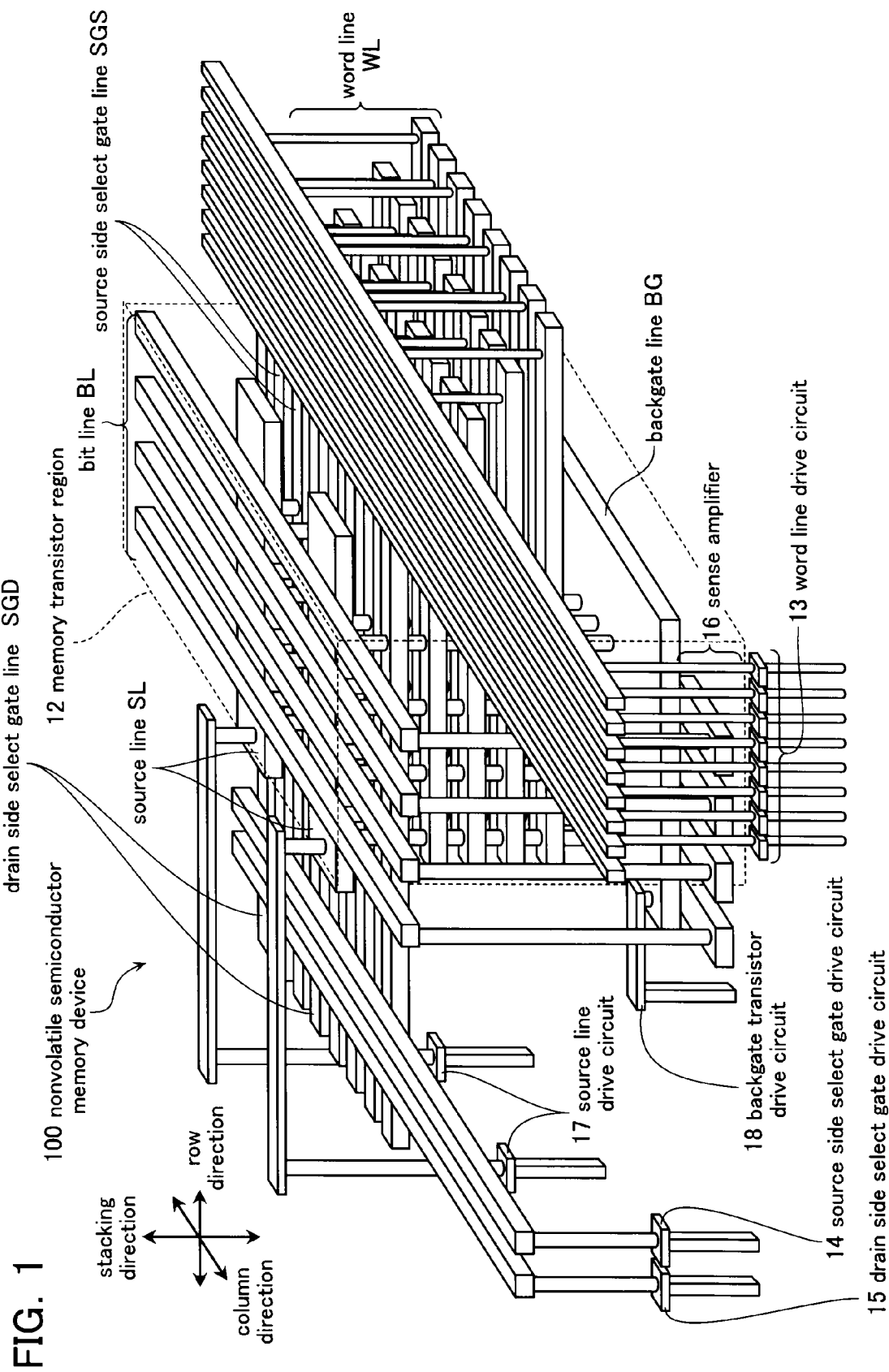
FIG. 1 is a schematic view of a configuration of a nonvolatile semiconductor memory device 100 in accordance with a first embodiment of the present invention.

FIG. 1 shows a schematic view of a nonvolatile semiconductor memory device 100 in accordance with a first embodiment of the present invention. As shown in FIG. 1, the nonvolatile semiconductor memory device 100 in accordance with the first embodiment mainly includes a memory transistor region 12, a word line drive circuit 13, a source side select gate line (SGS) drive circuit 14, a drain side select gate line (SGD) drive circuit 15, a sense amplifier 16, a source line drive circuit 17, and a back gate transistor drive circuit 18. The memory transistor region 12 includes memory transistors configured to store data. The word line drive circuit 13 controls a voltage applied to word lines WL. The source side select gate line (SGS) drive circuit 14 controls a voltage applied to a source side select gate line SGS. The drain side select gate line (SGD) drive circuit 15 controls a voltage applied to a drain side select gate line SGD. The sense amplifier 16 amplifies a potential read from the memory transistors. The source line drive circuit 17 controls a voltage applied to a source line SL. The back gate transistor drive circuit 18 controls a voltage applied to a back gate line BG. Note that, in addition to the above, the nonvolatile semiconductor memory device 100 in accordance with the first embodiment includes a bit line drive circuit (not shown) configured to control a voltage applied to a bit line BL.

Figure 2:
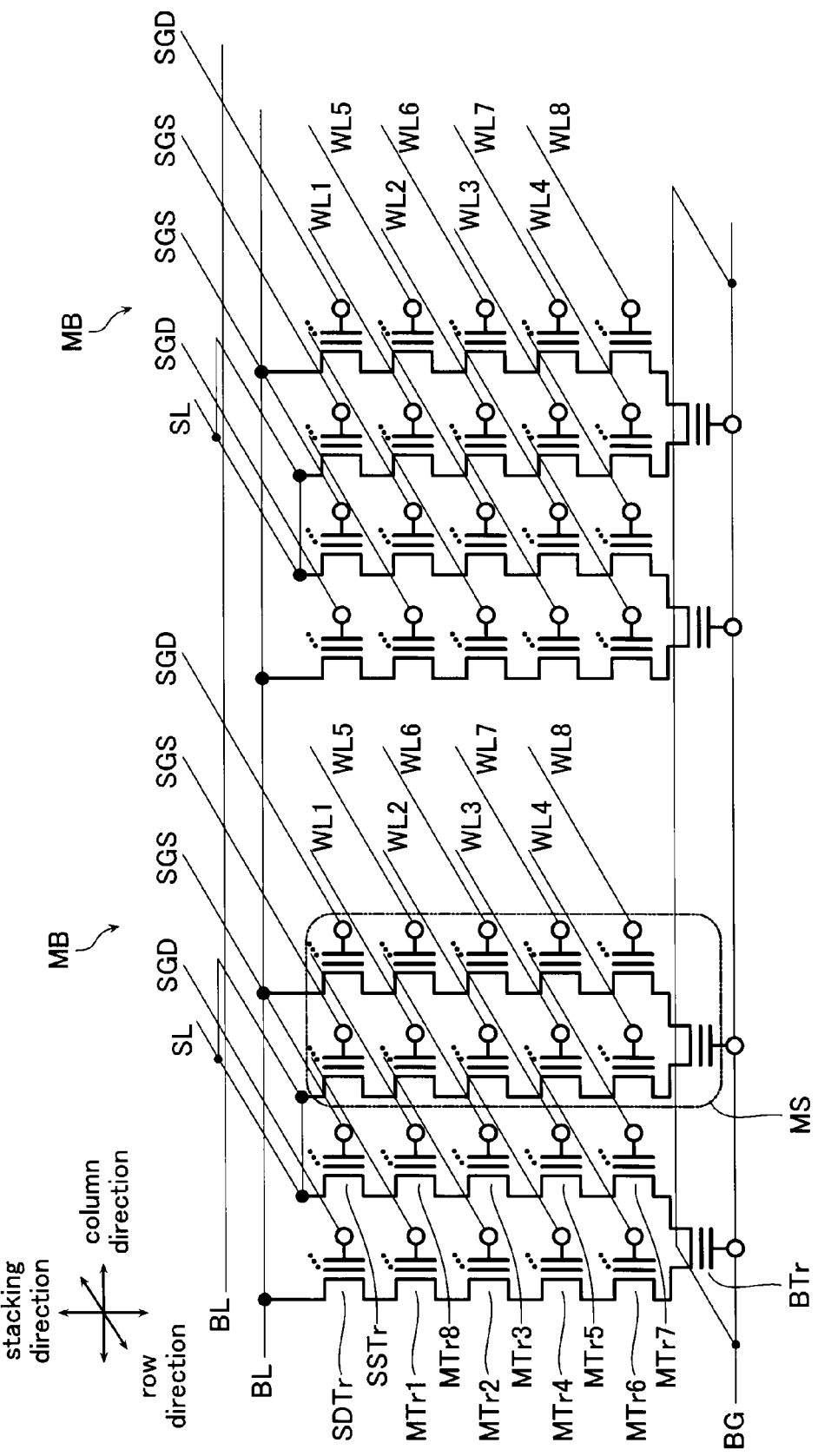
FIG. 2 is a circuit diagram of part of the nonvolatile semiconductor memory device in accordance with the first embodiment.

Next, a circuit configuration of the memory transistor region 12 is described with reference to FIG. 2. FIG. 2 is a circuit diagram of the memory transistor region 12.

The memory transistor region 12 is configured by a plurality of memory blocks MB, as shown in FIG. 2. Each of the memory blocks MB comprises a plurality of memory strings MS, source side select transistors SSTr, and drain side select transistors SDTr. Each of the memory strings MS is configured by memory transistors MTr1-MTr8 and a back gate transistor BTr connected in series. The memory transistors MTr1-MTr8 are configured by a MONOS structure and store information by storing a charge in a charge storage layer. The back gate transistor BTr is connected between the memory transistor MTr4 and the memory transistor MTr5. The drain side select transistor SDTr is connected to one end of the memory string MS (memory transistor MTr8). The source side select transistor is connected to the other end of the memory string MS (memory transistor MTr1).

As shown in FIG. 2, control gates of the memory transistors MTr1 arranged in a line in a row direction are commonly connected to a word line WL1 extending in the row direction. Similarly, control gates of the memory transistors MTr2-MTr8 respectively arranged in lines in the row direction are commonly connected to respective word lines WL2-WL8 extending in the row direction. Moreover, control gates of the back gate transistors BTr arranged in a matrix in the row direction and a column direction are commonly connected to the back gate line BG.

As shown in FIG. 2, control gates of the drain side select transistors SDTr arranged in a line in the row direction in the memory block MB are commonly connected to the drain side select gate line SGD. The drain side select gate line SGD is formed so as to extend in the row direction straddling a plurality of memory blocks MB. In addition, other ends of the drain side select transistors SDTr arranged in a line in the column direction are commonly connected to the bit line BL. The bit line BL is formed so as to extend in the column direction straddling a plurality of memory blocks MB.

As shown in FIG. 2, control gates of the source side select transistors SSTr arranged in a line in the row direction in the memory block MB are commonly connected to the source side select gate line SGS. The source side select gate line SGS is formed so as to extend in the row direction straddling a plurality of memory blocks MB. In addition, other ends of the source side select transistors SSTr are commonly connected to the source line SL. The source line SL is formed so as to extend in the row direction straddling a plurality of memory blocks MB.

Figure 3:
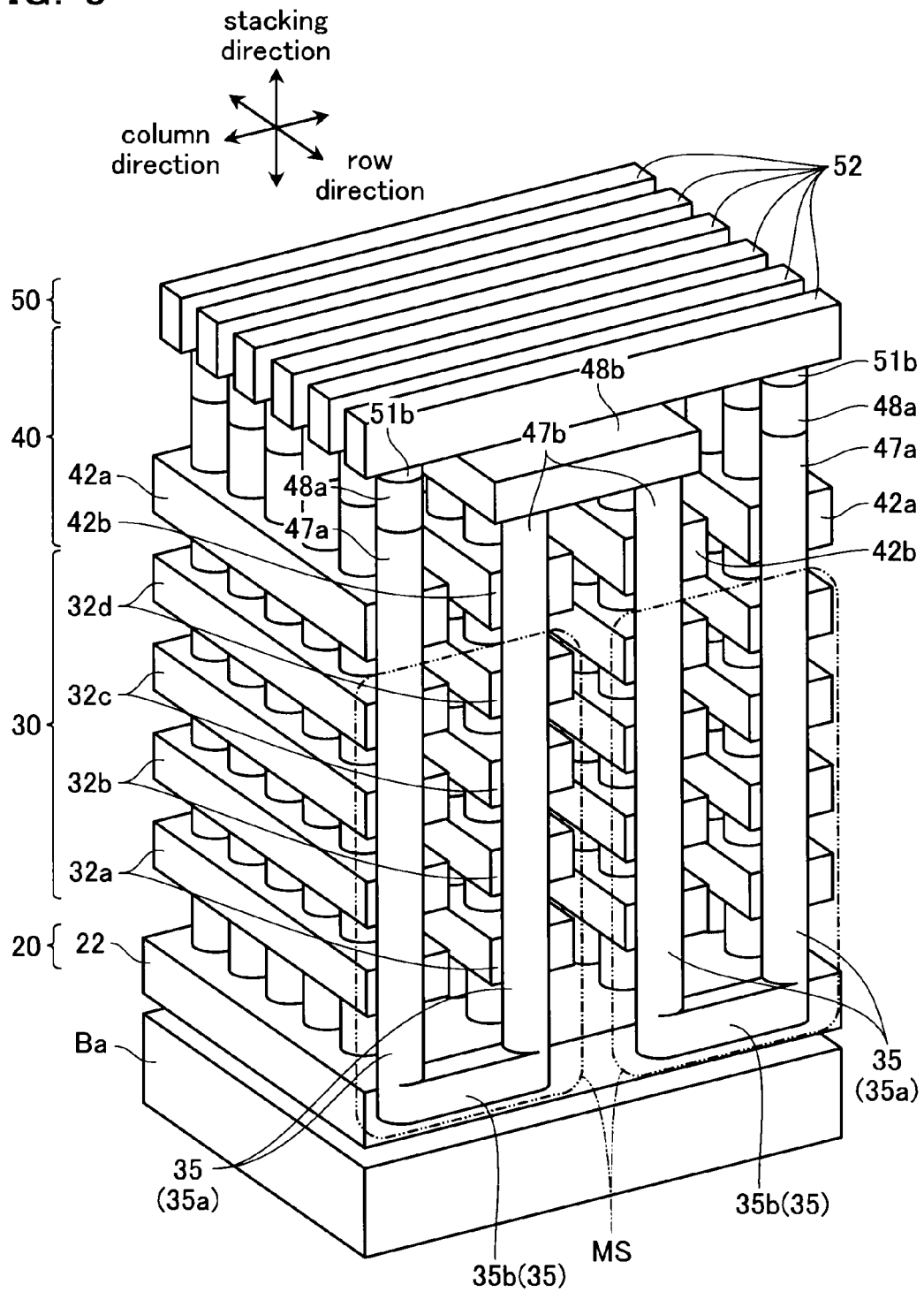
FIG. 3 is a partial perspective view of the nonvolatile semiconductor memory device 100 in accordance with the first embodiment.

Next, a stacking structure of the nonvolatile semiconductor memory device 100 in accordance with the first embodiment configured to realize the above-described circuit configuration shown in FIG. 2 is described with reference to FIGS. 3 and 4. FIG. 3 is a partial perspective view of the memory transistor region 12 in the nonvolatile semiconductor memory device 100 in accordance with the first embodiment, and FIG. 4 is a cross-sectional view of the memory transistor region 12.

Figure 4:
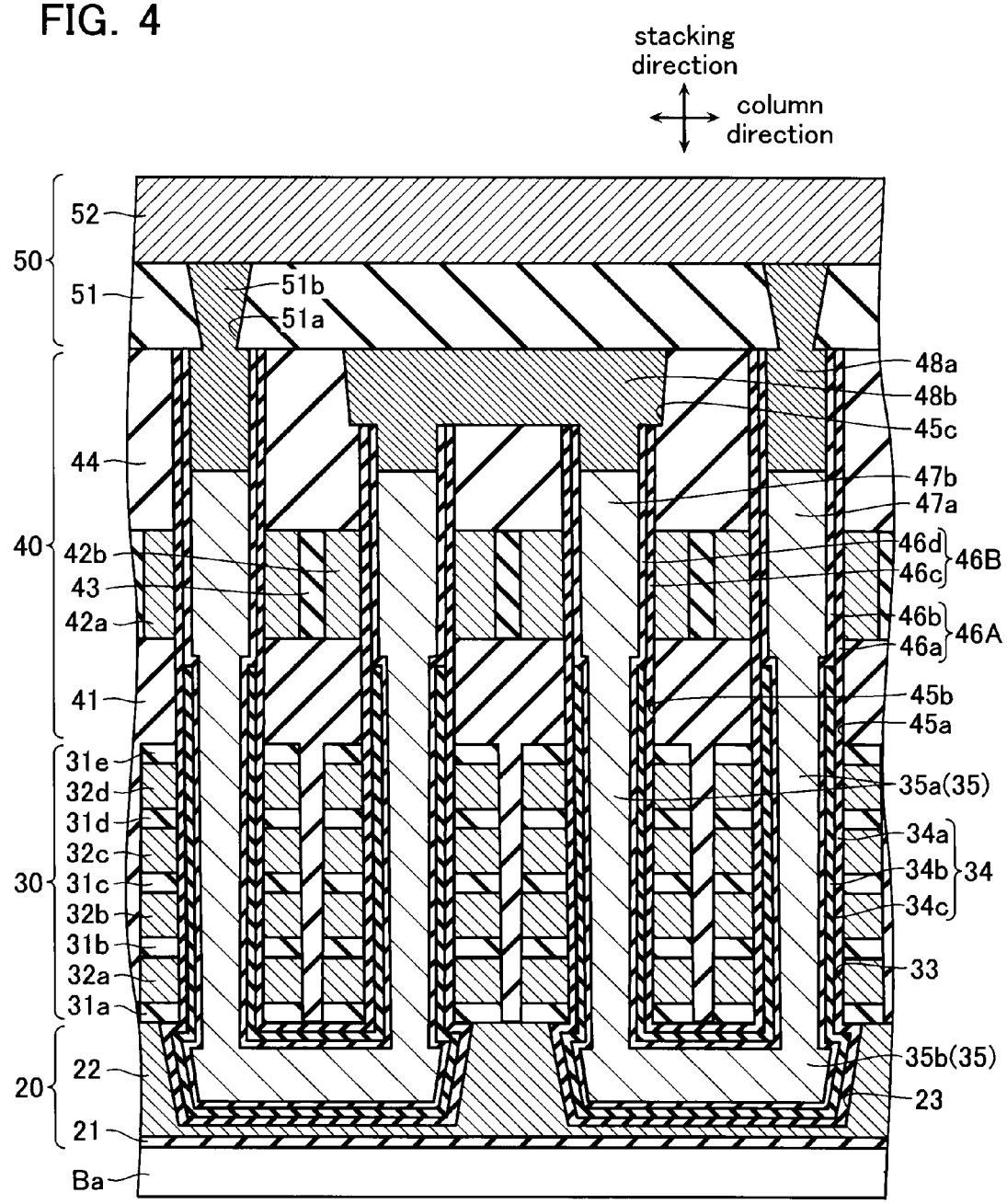
FIG. 4 is a cross-sectional view of the nonvolatile semiconductor memory device 100 in accordance with the first embodiment.

The memory transistor region 12 includes, sequentially, from the semiconductor substrate Ba in the stacking direction, a back gate transistor layer 20, a memory transistor layer 30, a select transistor layer 40, and a wiring layer 50, as shown in FIGS. 3 and 4. The back gate transistor layer 20 functions as the aforementioned back gate transistor BTr. The memory transistor layer 30 functions as the aforementioned memory string MS (memory transistors MTr1-MTr8). The select transistor layer 40 functions as the aforementioned source side select transistor SSTr and drain side select transistor SDTr.

The back gate transistor layer 20 includes a back gate insulating layer 21 and a back gate conductive layer 22 that are sequentially stacked on the semiconductor substrate Ba. The back gate insulating layer 21 and the back gate conductive layer 22 are formed extending in the row direction and the column direction to extremities of the memory transistor region 12.

The back gate conductive layer 22 is formed covering a lower surface and a side surface of a joining portion 35b of a U-shaped semiconductor layer 35 to be described hereafter, and to the same height as an upper surface of the joining portion 35b. The back gate insulating layer 21 is constituted by silicon oxide ($SiO_2$). The back gate conductive layer 22 is constituted by polysilicon (p-Si).

In addition, the back gate transistor layer 20 includes back gate holes 23 formed so as to dig out the back gate conductive layer 22. Each of the back gate holes 23 is configured to have an opening that is short in the row direction and long in the column direction. The back gate holes 23 are formed at certain intervals in the row direction and the column direction. That is to say, the back gate holes 23 are formed in a matrix in a plane that includes the row direction and the column direction.

The memory transistor layer 30 includes first through fifth inter-word line insulating layers 31a-31e, and first through fourth word line conductive layers 32a-32d, the layers 31a-31e and 32a-32d being alternately stacked above the back gate conductive layer 22.

The first through fifth inter-word line insulating layers 31a-31e and the first through fourth word line conductive layers 32a-32d are formed in a repeating manner in stripes extending in the row direction and having a certain spacing in the column direction. The first through fifth inter-word line insulating layers 31a-31e and the first through fourth word line conductive layers 32a-32d are shaped into a stepped shape at ends in the row direction. The first through fifth inter-word line insulating layers 31a-31e are constituted by silicon oxide ($SiO_2$). The first through fourth word line conductive layers 32a-32d are constituted by polysilicon (p-Si).

The memory transistor layer 30 includes memory holes 33 formed so as to penetrate the first through fifth inter-word line insulating layers 31a-31e and the first through fourth word line conductive layers 32a-32d. The memory holes 33 are formed so as to align with a position of a vicinity of both ends in the column direction of each of the back gate holes 23.

In addition, the above-described back gate transistor layer 20 and the memory transistor layer 30 include a memory gate insulating layer 34 and the U-shaped semiconductor layer 35.

The memory gate insulating layer 34 is formed on a side surface of the memory holes 33 and the back gate holes 23. The memory gate insulating layer 34 is configured by a block insulating layer 34a, a charge storage layer 34b, and a tunnel insulating layer 34c stacked sequentially from a side surface side of the memory holes 33 and the back gate holes 23. The block insulating layer 34a and the tunnel insulating layer 34c are constituted by silicon oxide ($SiO_2$). The charge storage layer 34b is constituted by silicon nitride (SiN). The block insulating layer 34a, the charge storage layer 34b, and the tunnel insulating layer 34c each have a thickness of 1.5-6 nm.

The U-shaped semiconductor layer 35 is formed in a U shape as viewed from the row direction. The U-shaped semiconductor layer 35 is formed so as to be in contact with the tunnel insulating layer 34c and so as to fill the back gate hole 23 and the memory holes 33. The U-shaped semiconductor layer 35 includes a pair of columnar portions 35a extending in a perpendicular direction with respect to the semiconductor substrate Ba as viewed from the row direction, and the joining portion 35b formed so as to join lower ends of the pair of columnar portions 35a. The U-shaped semiconductor layer 35 is constituted by polysilicon (p-Si).

As described hereafter, the U-shaped semiconductor layer 35 is formed through a process whereby amorphous silicon having an upper surface implanted with germanium ions is crystallized to polysilicon. Crystallization in the above-described process begins from the upper surface implanted with the germanium ions and spreads downward. As a result, grain diameter of the polysilicon crystals configuring the U-shaped semiconductor layer 35 is large compared to the case where germanium ions are not implanted.

In the above-described configuration of the back gate transistor layer 20 and the memory transistor layer 30, the back gate conductive layer 22 functions as a control gate electrode of the back gate transistor BTr. The back gate conductive layer 22 functions as the back gate line BG. The first through fourth word line conductive layers 32a-32d function as control gate electrodes of the memory transistors MTr1-MTr8. The first through fourth word line conductive layers 32a-32d function as the word lines WL1-WL8.

Expressing the above-described configuration of the memory transistor layer 30 in other words, the tunnel insulating layer 34c is formed so as to surround a side surface of the columnar portion 35a. The charge storage layer 34b is formed so as to surround a side surface of the tunnel insulating layer 34c. The block insulating layer 34a is formed so as to surround a side surface of the charge storage layer 34b. The first through fourth word line conductive layers 32a-32d are formed so as to surround a side surface of the block insulating layer 34a.

The select transistor layer 40 includes an interlayer insulating layer 41 deposited on the memory transistor layer 30, a drain side conductive layer 42a, a source side conductive layer 42b, an inter-select transistor interlayer insulating layer 43, and an interlayer insulating layer 44. The interlayer insulating layer 41 is formed so as to be in contact with an upper surface of the fifth inter-word line insulating layer 31e and side surfaces of the first through fifth inter-word line insulating layers 31a-31e and the first through fourth word line conductive layers 32a-32d. The drain side conductive layer 42a, the source side conductive layer 42b, and the inter-select transistor interlayer insulating layer 43 are formed in a repeating manner in stripes extending in the row direction and having a certain spacing in the column direction.

The drain side conductive layer 42a is formed extending in the row direction and having a certain pitch in the column direction. Similarly, the source side conductive layer 42b is formed extending in the row direction and having a certain pitch in the column direction. A pair of the drain side conductive layers 42a and a pair of the source side conductive layers 42b are formed alternately in the column direction. The inter-select transistor interlayer insulating layer 43 is formed between the drain side conductive layer 42a and the source side conductive layer 42b formed as described above. The interlayer insulating layer 44 is formed above the drain side conductive layer 42a, the source side conductive layer 42b and the inter-select transistor interlayer insulating layer 43.

The drain side conductive layer 42a and the source side conductive layer 42b are constituted by polysilicon (p-Si). The interlayer insulating layers 41 and 44, and the inter-select transistor interlayer insulating layer 43 are constituted by silicon oxide ($SiO_2$).

In addition, the select transistor layer 40 includes drain side holes 45a, source side holes 45b, and a source line wiring trench 45c.

Each of the drain side holes 45a is formed so as to penetrate the interlayer insulating layer 44, the drain side conductive layer 42a, and the interlayer insulating layer 41. Each of the source side holes 45b is formed so as to penetrate the interlayer insulating layer 44, the source side conductive layer 42b, and the interlayer insulating layer 41. The drain side holes 45a and the source side holes 45b are formed at a position aligning with the memory holes 33. The source line wiring trench 45c is formed so as to dig out the interlayer insulating layer 44 at an upper portion of the source side holes 45b adjacent in the column direction. The source line wiring trench 45c is formed so as to connect the upper portion of the source side holes 45b adjacent in the column direction and so as to extend in the row direction.

Furthermore, the select transistor layer 40 includes drain side gate insulating layers 46A, source side gate insulating layers 46B, drain side columnar semiconductor layers 47a, source side columnar semiconductor layers 47b, plug conductive layers 48a, and a source line conductive layer 48b.

The drain side gate insulating layer 46A is formed on a side surface of the drain side hole 45a. The drain side gate insulating layer 46A is configured by first and second drain side gate insulating layers 46a and 46b stacked sequentially from a side surface side of the drain side hole 45a. The first and second drain side gate insulating layers 46a and 46b are constituted by silicon oxide ($SiO_2$). The first and second drain side gate insulating layers 46a and 46b have a thickness of 1.5-6 nm. The first drain side gate insulating layer 46a is formed continuously in an integrated manner with the block insulating layer 34a. The second drain side gate insulating layer 46b is formed continuously in an integrated manner with the tunnel insulating layer 34c. Note that the first drain side gate insulating layer 46a may be formed discontinuously with the block insulating layer 34a.

The source side gate insulating layer 46B is formed on a side surface of the source side hole 45b. The source side gate insulating layer 46B is configured by first and second source side gate insulating layers 46c and 46d stacked sequentially from a side surface side of the source side hole 45b. The first and second source side gate insulating layers 46c and 46d are constituted by silicon oxide ($SiO_2$). The first and second source side gate insulating layers 46c and 46d have a thickness of 1.5-6 nm. The first source side gate insulating layer 46c is formed continuously in an integrated manner with the block insulating layer 34a. The second source side gate insulating layer 46d is formed continuously in an integrated manner with the tunnel insulating layer 34c. Note that the first source side gate insulating layer 46c may be formed discontinuously with the block insulating layer 34a.

The drain side columnar semiconductor layer 47a is formed so as to be in contact with the drain side gate insulating layer 46A to a certain height within the drain side hole 45a. The drain side columnar semiconductor layer 47a is constituted by polysilicon (p-Si). The drain side columnar semiconductor layer 47a is formed continuously in an integrated manner with the U-shaped semiconductor layer 35.

The source side columnar semiconductor layer 47b is formed so as to be in contact with the source side gate insulating layer 46B to a certain height within the source side hole 45b. The source side columnar semiconductor layer 47b is constituted by polysilicon (p-Si). The source side columnar semiconductor layer 47b is formed continuously in an integrated manner with the U-shaped semiconductor layer 35.

The plug conductive layer 48a is formed so as to fill the drain side hole 45a from the certain height within the drain side hole 45a to an upper surface of the select transistor layer 40. The source line conductive layer 48b is formed so as to fill the source side holes 45b and the source line wiring trench 45c from the certain height within the source side holes 45b to the upper surface of the select transistor layer 40. The plug conductive layer 48a and the source line conductive layer 48b are constituted by a stacking structure of tungsten (W)/titanium nitride (TiN)/titanium (Ti).

In the above-described configuration of the select transistor layer 40, the drain side conductive layer 42a functions as a control gate electrode of the drain side select transistor SDTr, and also as the drain side select gate line SGD. The source side conductive layer 42b functions as a control gate electrode of the source side select transistor SSTr, and also as the source side select gate line SGS. The source line conductive layer 48b functions as the source line SL.

Expressing the above-described configuration of the select transistor layer 40 in other words, the second drain side gate insulating layer 46b is formed so as to surround a side surface of the drain side columnar semiconductor layer 47a. The first drain side gate insulating layer 46a is formed so as to surround a side surface of the second drain side gate insulating layer 46b. The drain side conductive layer 42a is formed so as to surround a side surface of the first drain side gate insulating layer 46a. The second source side gate insulating layer 46d is formed so as to surround a side surface of the source side columnar semiconductor layer 47b. The first source side gate insulating layer 46c is formed so as to surround a side surface of the second source side gate insulating layer 46d. The source side conductive layer 42b is formed so as to surround a side surface of the first source side gate insulating layer 46c.

The wiring layer 50 includes an interlayer insulating layer 51, holes 51a, plug layers 51b, and a bit line layer 52. The interlayer insulating layer 51 is formed on the upper surface of the select transistor layer 40. The hole 51a is formed penetrating the interlayer insulating layer 51 at a position aligning with the drain side hole 45a. The plug layer 51b is formed to an upper surface of the interlayer insulating layer 51 so as to fill the hole 51a. The bit line layer 52 is formed in lines extending in the column direction with a certain pitch in the row direction so as to be in contact with an upper surface of the plug layer 51b. The interlayer insulating layer 51 is constituted by silicon oxide ($SiO_2$). The plug layer 51b and the bit line layer 52 are constituted by a stacking structure of tungsten (W)/titanium nitride (TiN)/titanium (Ti).

In the above-described configuration of the wiring layer 50, the bit line layer 52 functions as the bit line BL.

(Method of Manufacturing the Nonvolatile Semiconductor Memory Device 100 in Accordance with the First Embodiment)

Next, a method of manufacturing the nonvolatile semiconductor memory device 100 in accordance with the first embodiment is described with reference to FIGS. 5-23. FIGS. 5-23 are cross-sectional views showing a manufacturing process of the nonvolatile semiconductor memory device 100 in accordance with the first embodiment.

Figure 5:
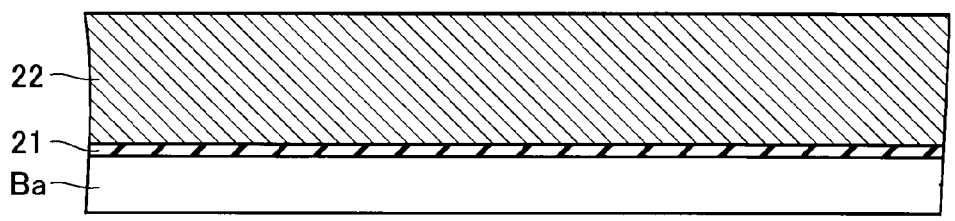
FIG. 5 is a cross-sectional view showing a manufacturing process of the nonvolatile semiconductor memory device 100 in accordance with the first embodiment.

First, silicon oxide ($SiO_2$) and polysilicon (p-Si) are deposited on the semiconductor substrate Ba to form the back gate insulating layer 21 and the back gate conductive layer 22, as shown in FIG. 5.

Figure 6:
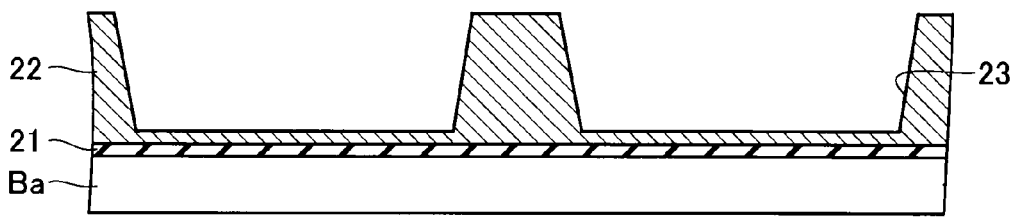
FIG. 6 is a cross-sectional view showing a manufacturing process of the nonvolatile semiconductor memory device 100 in accordance with the first embodiment.

Next, the back gate conductive layer 22 is dug out using lithography and RIE (Reactive Ion Etching) to form the back gate holes 23, as shown in FIG. 6.

Figure 7:
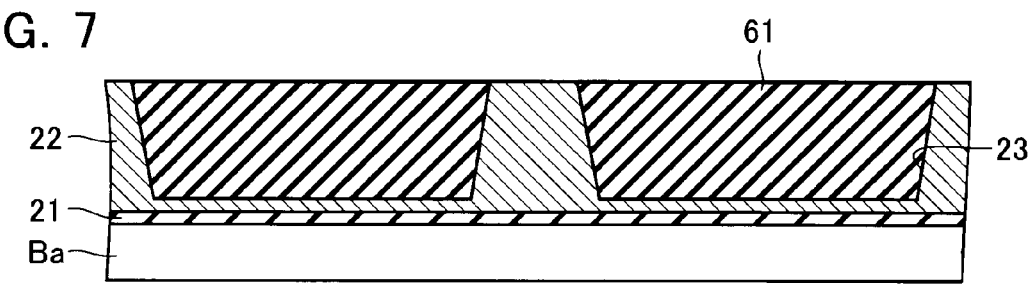
FIG. 7 is a cross-sectional view showing a manufacturing process of the nonvolatile semiconductor memory device 100 in accordance with the first embodiment.

Then, silicon nitride (SiN) is deposited so as to fill the back gate holes 23, thereby forming sacrifice layers 61, as shown in FIG. 7.

Figure 8:
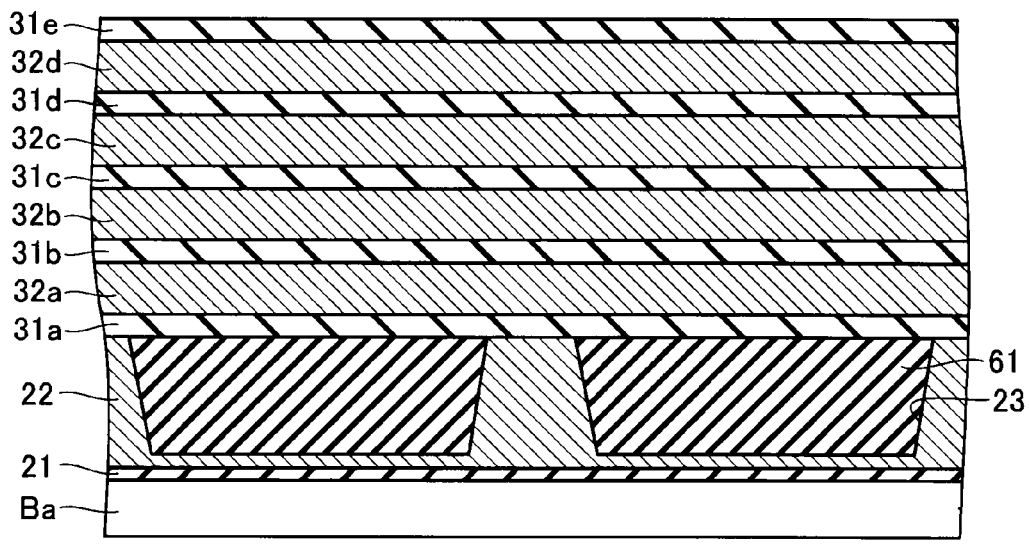
FIG. 8 is a cross-sectional view showing a manufacturing process of the nonvolatile semiconductor memory device 100 in accordance with the first embodiment.

Next, silicon oxide ($SiO_2$) and polysilicon (p-Si) are alternately deposited on the back gate conductive layer 22 and the sacrifice layers 61 to form the first through fifth inter-word line insulating layers 31a-31e and the first through fourth word line conductive layers 32a-32d, as shown in FIG. 8.

Figure 9:
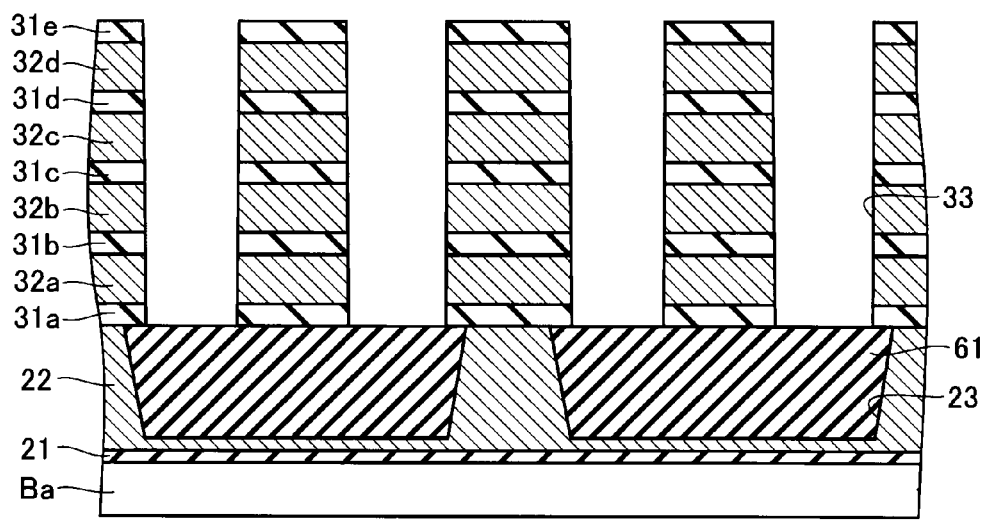
FIG. 9 is a cross-sectional view showing a manufacturing process of the nonvolatile semiconductor memory device 100 in accordance with the first embodiment.

Subsequently, the first through fifth inter-word line insulating layers 31a-31e and the first through fourth word line conductive layers 32a-32d are penetrated to form the memory holes 33, as shown in FIG. 9. The memory holes 33 are formed to reach an upper surface of both ends in the column direction of the sacrifice layers 61.

Figure 10:
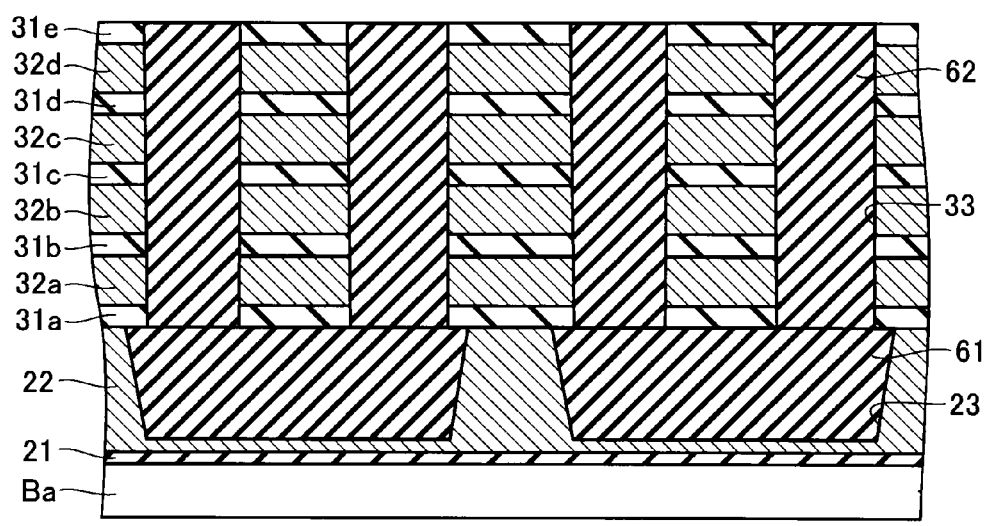
FIG. 10 is a cross-sectional view showing a manufacturing process of the nonvolatile semiconductor memory device 100 in accordance with the first embodiment.

Next, silicon nitride (SiN) is deposited so as to fill the memory holes 33, thereby forming sacrifice layers 62, as shown in FIG. 10.

Figure 11:
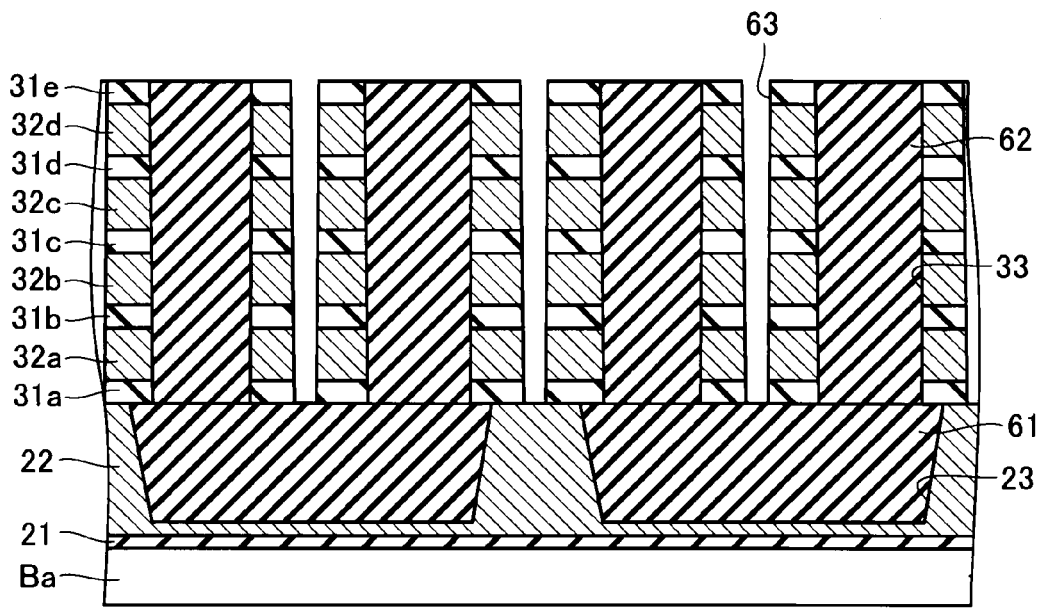
FIG. 11 is a cross-sectional view showing a manufacturing process of the nonvolatile semiconductor memory device 100 in accordance with the first embodiment.

Subsequently, the first through fifth inter-word line insulating layers 31a-31e and the first through fourth word line conductive layers 32a-32d are penetrated to form trenches 63, as shown in FIG. 11. The trenches 63 are formed between the memory holes 33 lined up in the column direction. The trenches 63 are formed so as to extend in the row direction.

Figure 12:
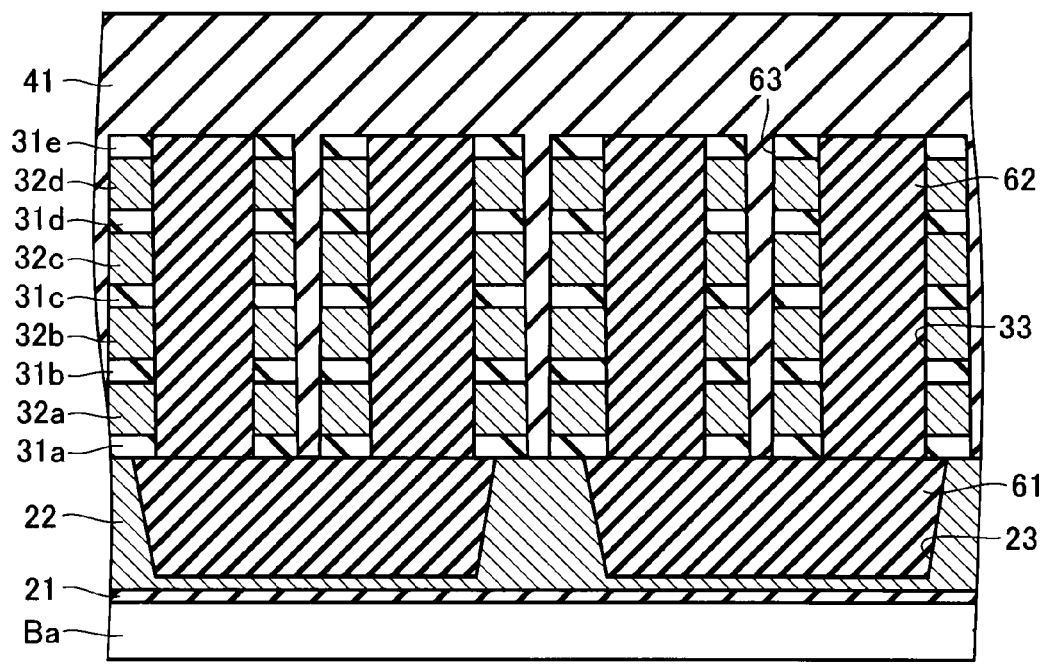
FIG. 12 is a cross-sectional view showing a manufacturing process of the nonvolatile semiconductor memory device 100 in accordance with the first embodiment.

Next, silicon oxide ($SiO_2$) is deposited so as to fill the trenches 63, thereby forming the interlayer insulating layer 41, as shown in FIG. 12.

Figure 13:
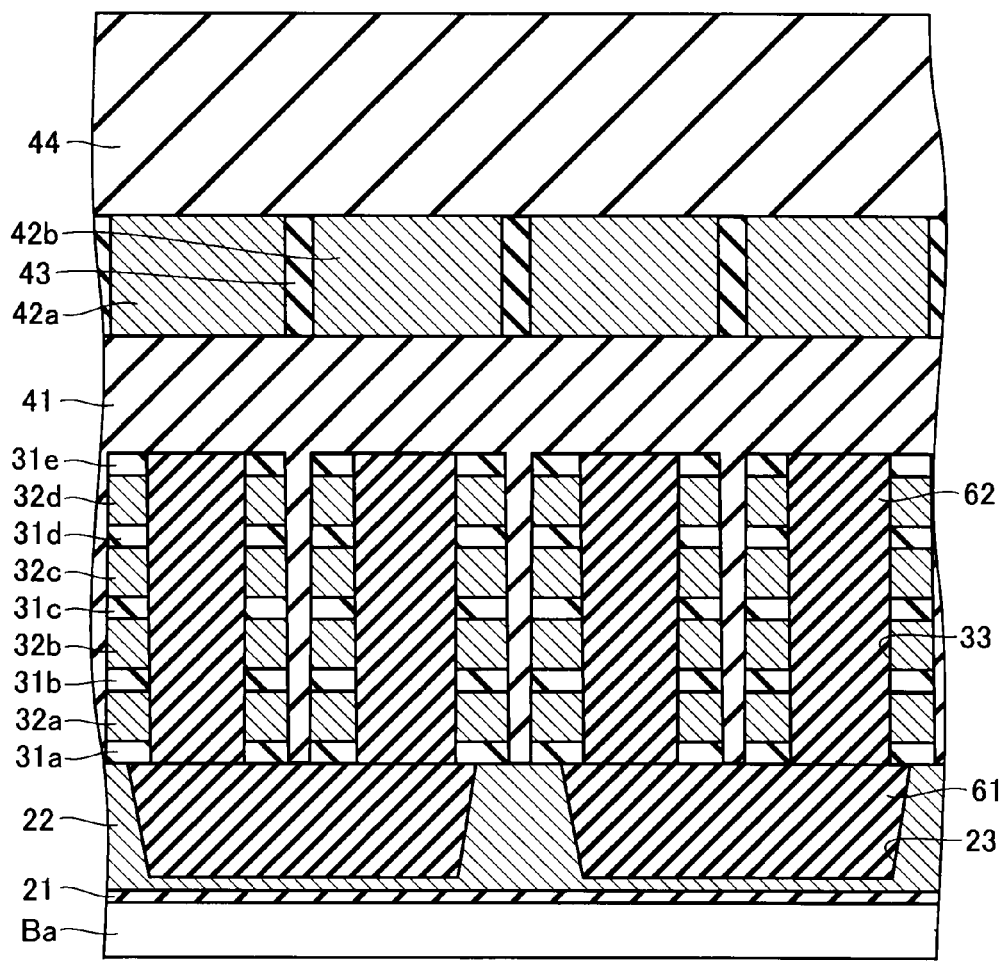
FIG. 13 is a cross-sectional view showing a manufacturing process of the nonvolatile semiconductor memory device 100 in accordance with the first embodiment.

Then, polysilicon (p-Si) is deposited on the interlayer insulating layer 41 and, subsequent to processing of this deposited polysilicon (p-Si) using lithography and RIE, silicon oxide ($SiO_2$) is deposited on the interlayer insulating layer 41, thereby forming the drain side conductive layers 42a, the source side conductive layers 42b, the inter-select transistor interlayer insulating layers 43, and the interlayer insulating layer 44, as shown in FIG. 13. Here, the drain side conductive layers 42a, the source side conductive layers 42b, and the inter-select transistor interlayer insulating layers 43 are formed so as to extend in the row direction with a certain pitch in the column direction. Pairs of the drain side conductive layers 42a and pairs of the source side conductive layers 42b are formed so as to be arranged alternately in the column direction.

Figure 14:
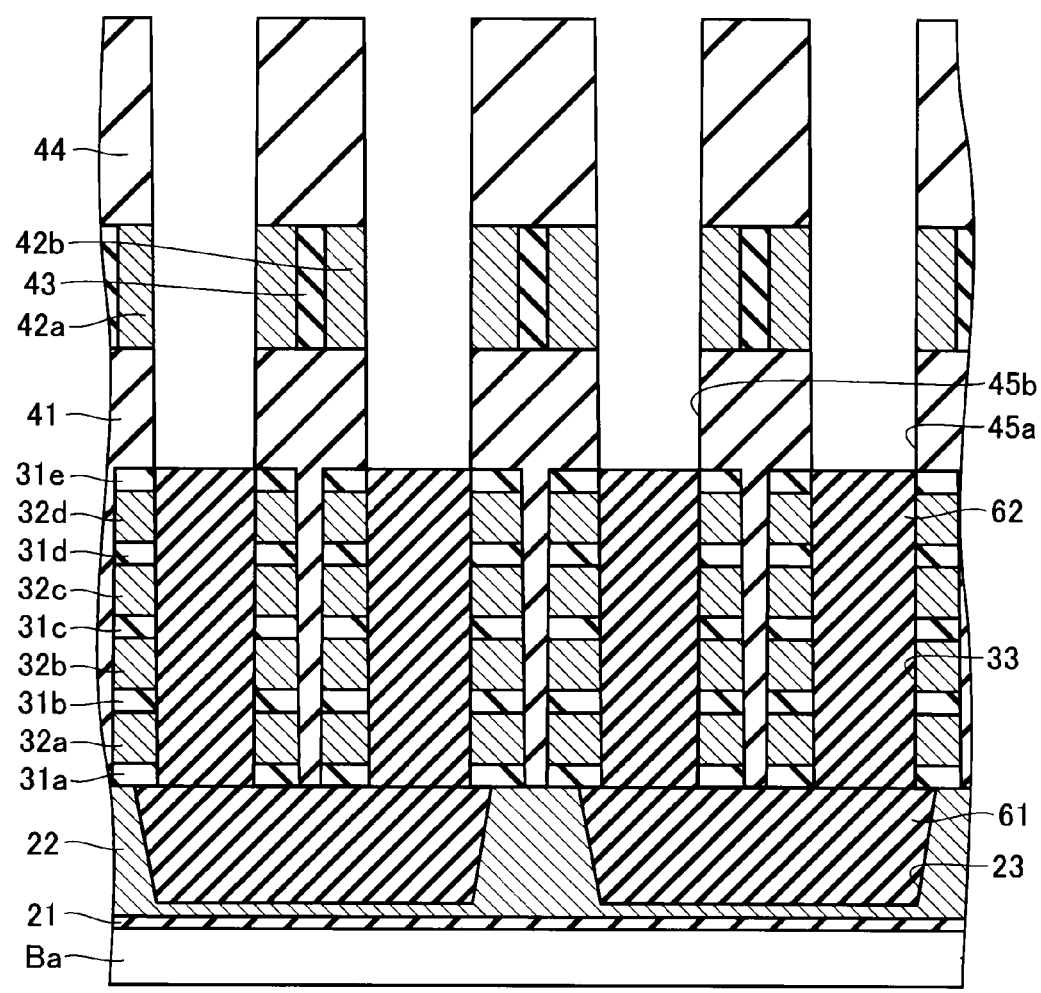
FIG. 14 is a cross-sectional view showing a manufacturing process of the nonvolatile semiconductor memory device 100 in accordance with the first embodiment.

Next, as shown in FIG. 14, the interlayer insulating layer 44, the drain side conductive layer 42a, and the interlayer insulating layer 41 are penetrated to form the drain side holes 45a; further, the interlayer insulating layer 44, the source side conductive layer 42b, and the interlayer insulating layer 41 are penetrated to form the source side holes 45b. The drain side holes 45a and the source side holes 45b are formed at a position aligning with the memory holes 33.

Figure 15:
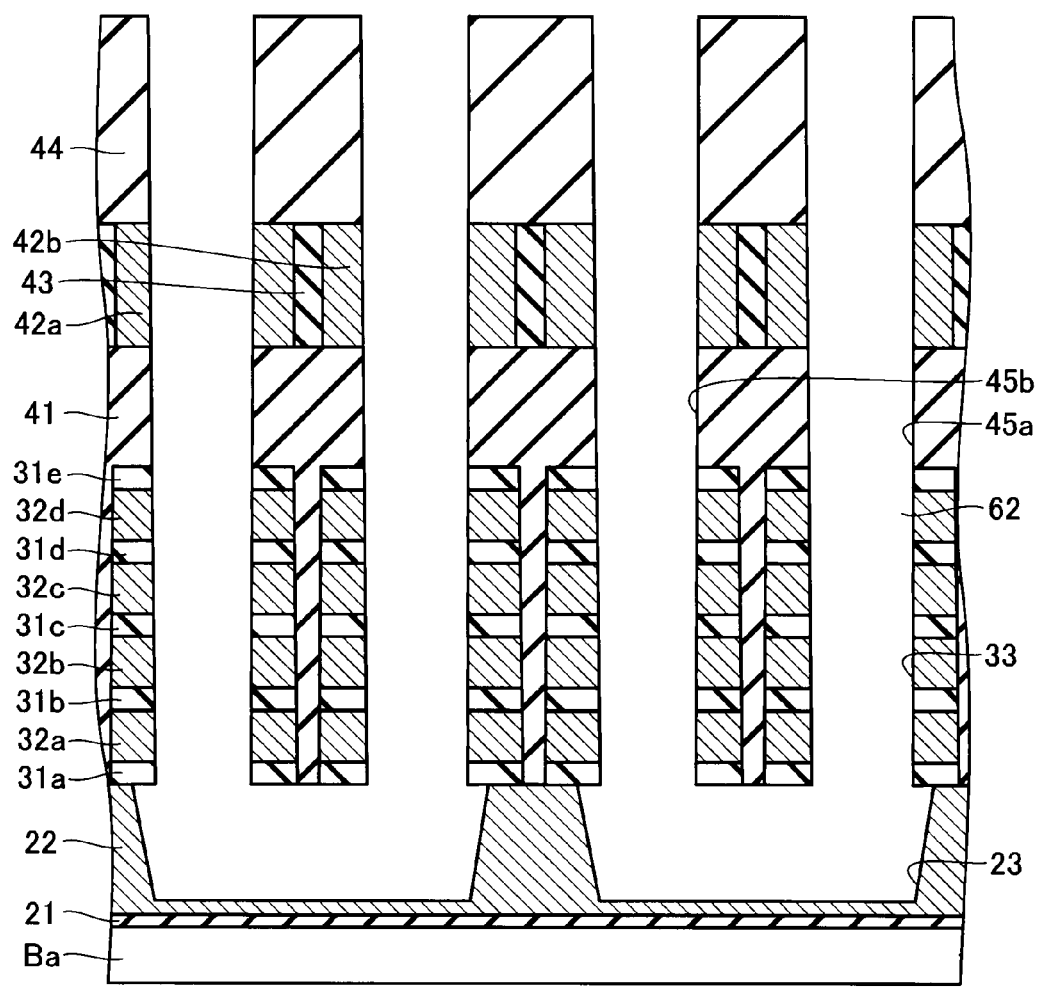
FIG. 15 is a cross-sectional view showing a manufacturing process of the nonvolatile semiconductor memory device 100 in accordance with the first embodiment.

Subsequently, the sacrifice layers 61 and 62 are removed by hot phosphoric acid solution, as shown in FIG. 15.

Figure 16:
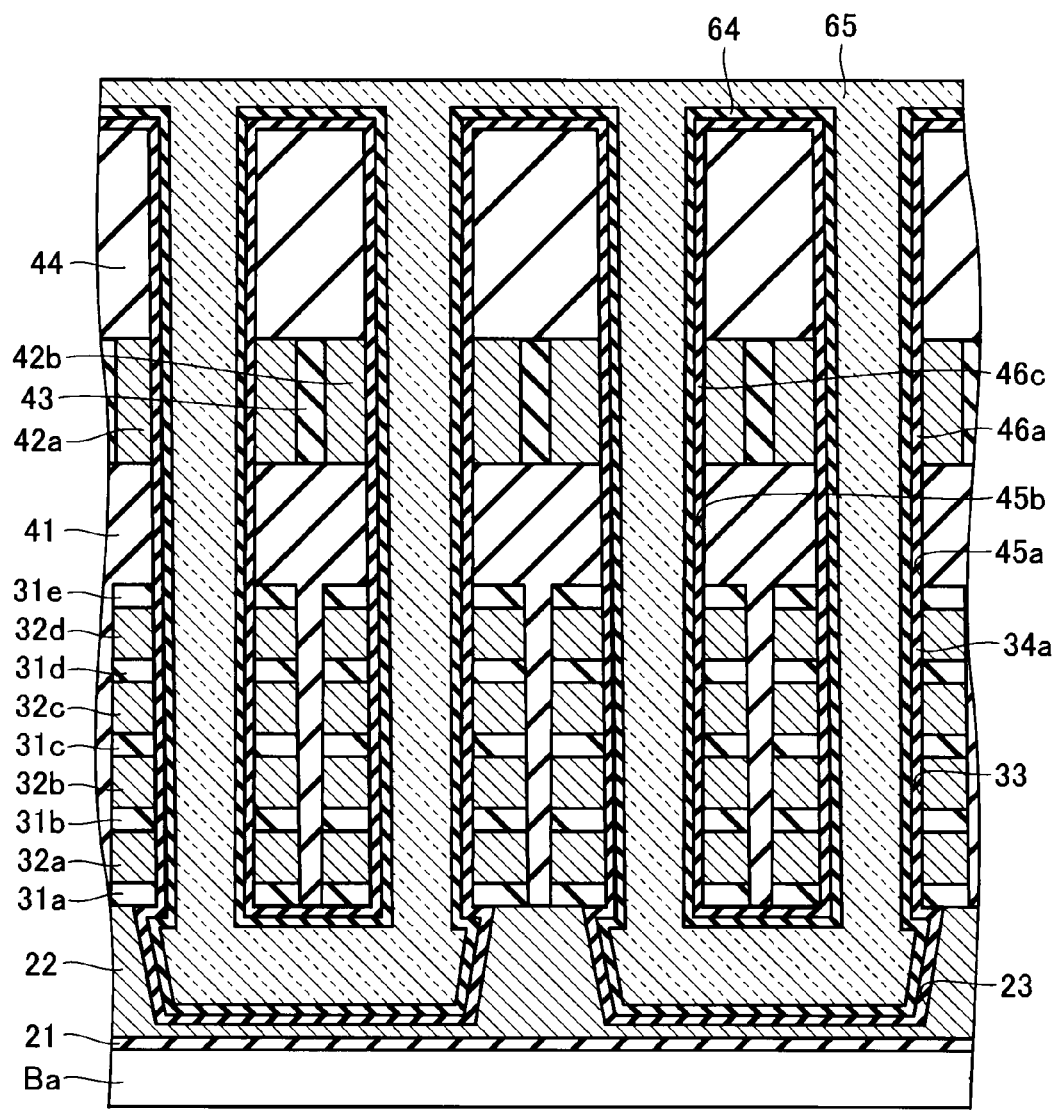
FIG. 16 is a cross-sectional view showing a manufacturing process of the nonvolatile semiconductor memory device 100 in accordance with the first embodiment.

Next, silicon oxide ($SiO_2$), silicon nitride (SiN), and amorphous silicon (a-Si) are deposited, as shown in FIG. 16. Through this process, the block insulating layer 34a, and the first drain side gate insulating layer 46a and first source side gate insulating layer 46c are formed continuously in an integrated manner. In addition, a silicon nitride layer 64 and a sacrifice layer 65 are formed through this process. The silicon nitride layer 64 is formed so as to cover side surfaces of the block insulating layer 34a, and the first drain side gate insulating layer 46a and first source side gate insulating layer 46c. The sacrifice layer 65 is formed so as to fill the back gate holes 23, the memory holes 33, the drain side holes 45a, and the source side holes 45b.

Figure 17:
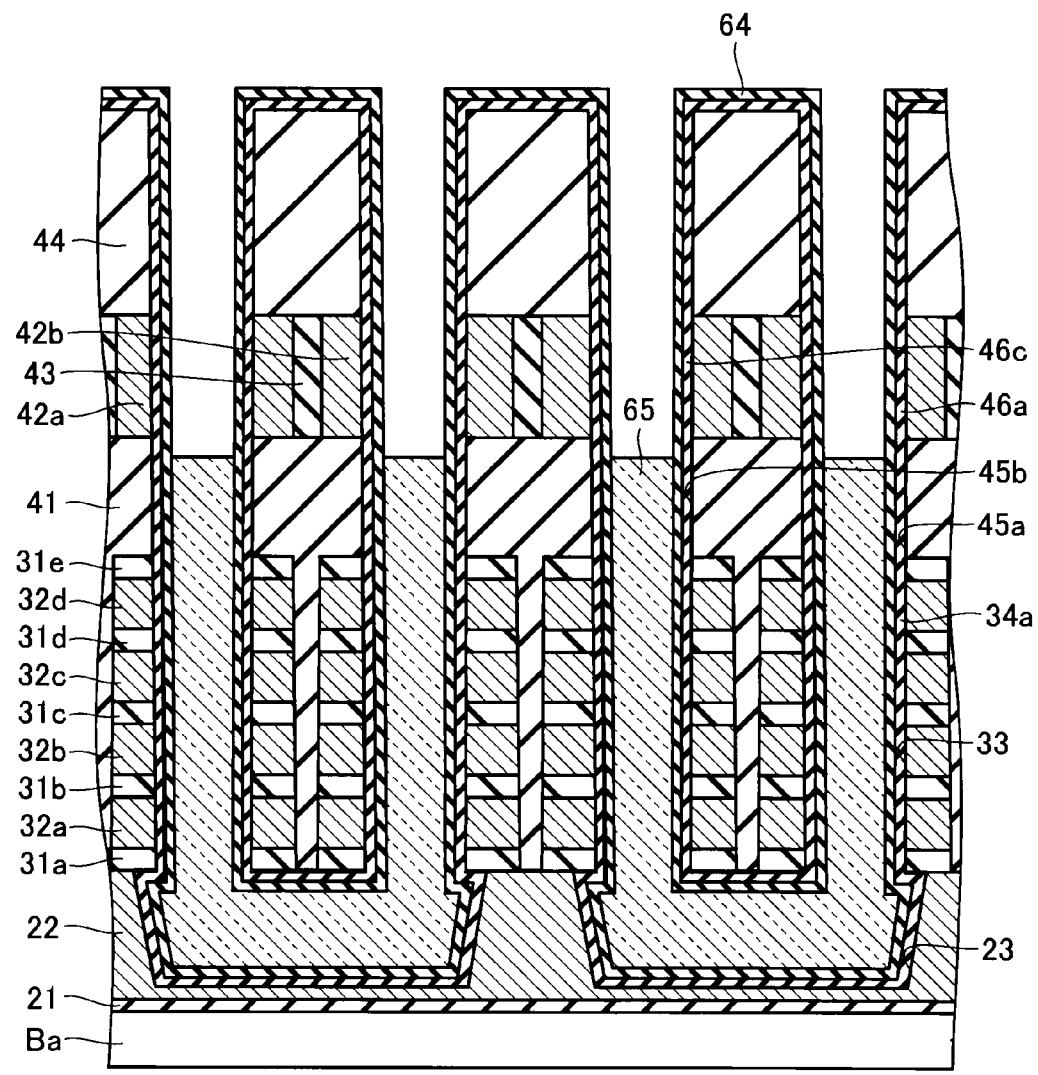
FIG. 17 is a cross-sectional view showing a manufacturing process of the nonvolatile semiconductor memory device 100 in accordance with the first embodiment.

Then, Reactive Ion Etching (RIE) is used to dig out the sacrifice layer 65 such that an upper surface of the sacrifice layer 65 is positioned between the drain side conductive layer 42a (source side conductive layer 42b) and the fifth inter-word line insulating layer 31e, as shown in FIG. 17.

Figure 18:
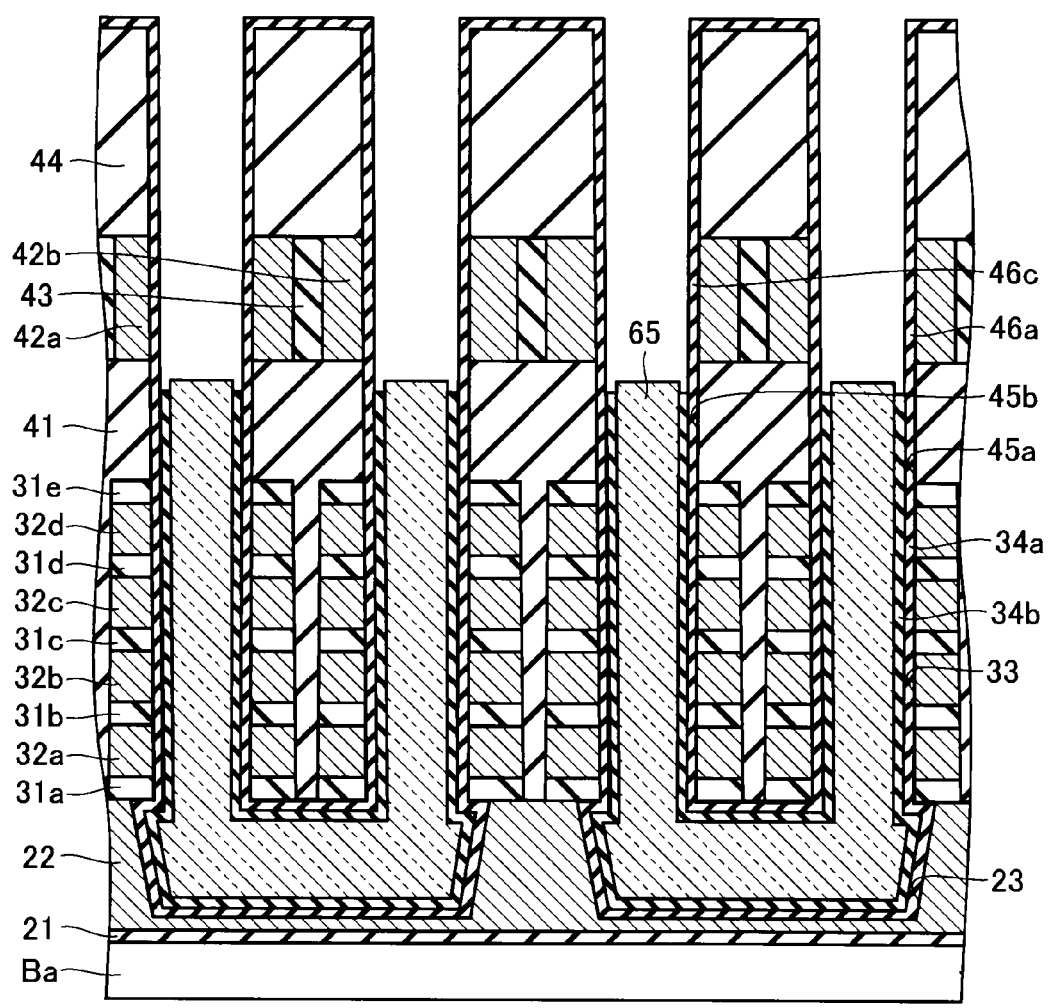
FIG. 18 is a cross-sectional view showing a manufacturing process of the nonvolatile semiconductor memory device 100 in accordance with the first embodiment.

Next, the silicon nitride layer 64 is selectively removed in hot phosphoric acid solution, using the sacrifice layer 65 as a mask, as shown in FIG. 18. That is, the silicon nitride layer 64 not covered by the sacrifice layer 65 is removed. Through this process, the silicon nitride layer 64 becomes the charge storage layer 34b.

Note that in the process shown in FIG. 18, the first drain side gate insulating layer 46a and the first source side gate insulating layer 46c may be removed along with the silicon nitride layer 64. In such a case, silicon oxide ($SiO_2$) is deposited or formed by thermal oxidation on a side surface of the drain side holes 45a and a side surface of the source side holes 45b, followed by removal of silicon oxide film at the bottom of the drain side holes 45a and source side holes 45b to reform the first drain side gate insulating layer 46a and the first source side gate insulating layer 46c.

Figure 19:
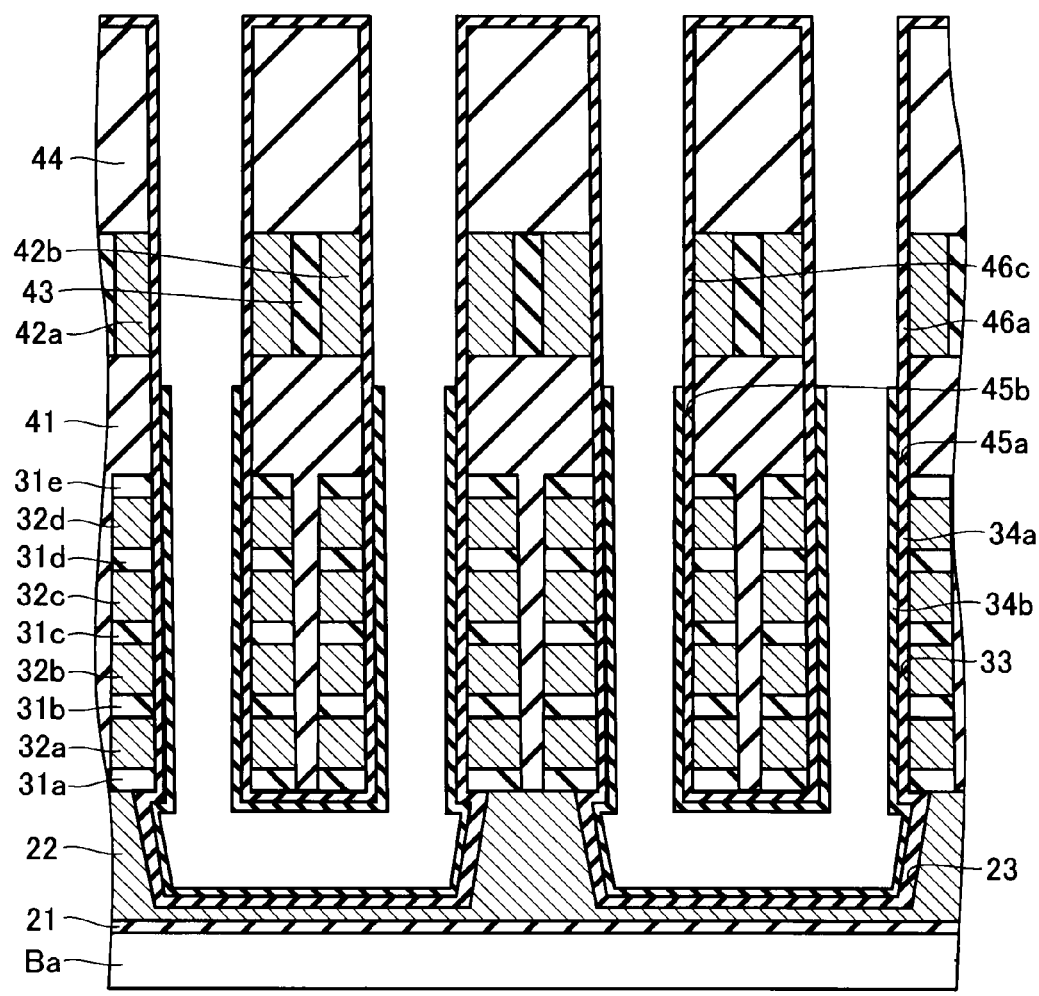
FIG. 19 is a cross-sectional view showing a manufacturing process of the nonvolatile semiconductor memory device 100 in accordance with the first embodiment.

Subsequently, the sacrifice layer 65 is removed in an organic alkaline solution, as shown in FIG. 19.

Figure 20:
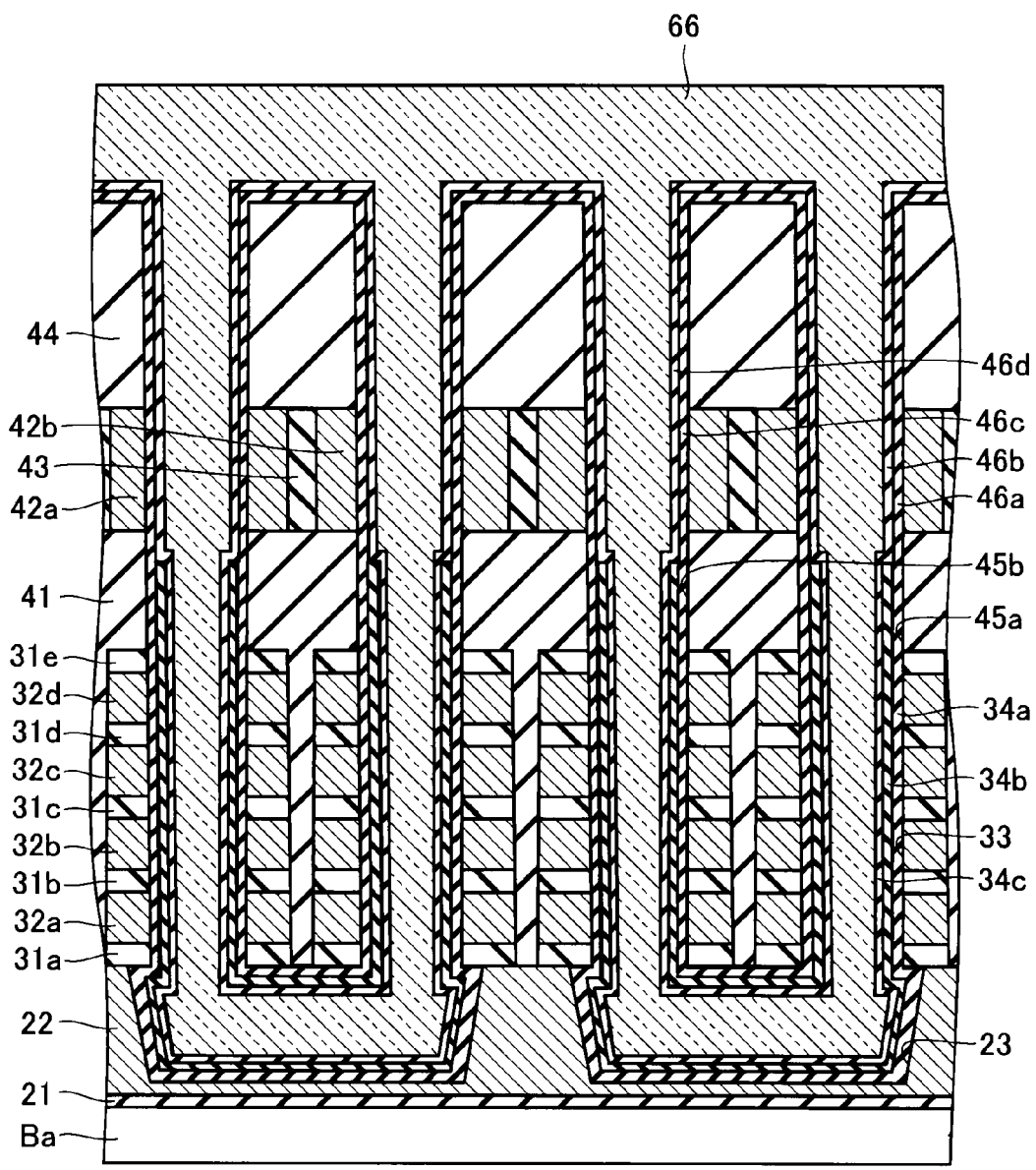
FIG. 20 is a cross-sectional view showing a manufacturing process of the nonvolatile semiconductor memory device 100 in accordance with the first embodiment.

Next, silicon oxide ($SiO_2$) and amorphous silicon (a-Si) are deposited so as to fill the back gate holes 23, the memory holes 33, the drain side holes 45a, and the source side holes 45b, as shown in FIG. 20. Through this process, the tunnel insulating layer 34c, and the second drain side gate insulating layer 46b and second source side gate insulating layer 46d are formed continuously in an integrated manner. Moreover, an amorphous silicon layer 66 is formed on an upper layer of the tunnel insulating layer 34c, and the second drain side gate insulating layer 46b and second source side gate insulating layer 46d.

Figure 21:
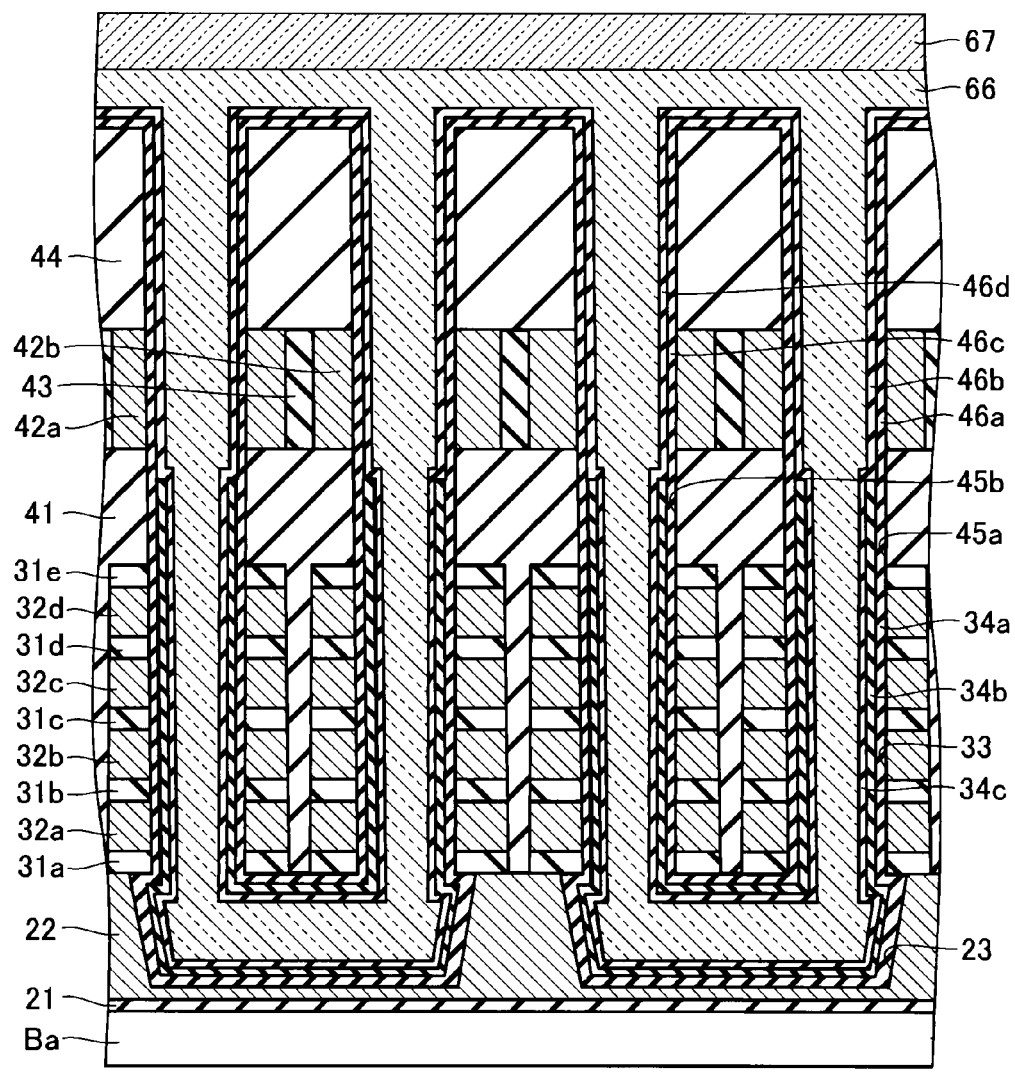
FIG. 21 is a cross-sectional view showing a manufacturing process of the nonvolatile semiconductor memory device 100 in accordance with the first embodiment.

Then, germanium (Ge) ions are implanted into an upper surface of the amorphous silicon layer 66, as shown in FIG. 21. The germanium ions are implanted with an acceleration energy of 5 keV, an area density of $5 \times 10^{15}$ cm$^{-2}$, and a tilt of 30°, for example. Moreover, as an after-treatment, metal contamination due to the ion implantation is removed in a solution comprising a mixture of sulphuric acid and hydrogen peroxide. Through these processes, a layer 67 implanted with germanium ions is formed in the upper surface of the amorphous silicon layer 66. Now, germanium (Ge) has a melting point lower than that of silicon (Si).

In the above-described FIG. 21, an upper limit for the concentration of implanted germanium is desirably 20%-30% to prevent the silicon germanium from dissolving in wet treatment subsequent to the ion implantation. On the other hand, to lower a crystallization temperature locally by about 10 K or more, germanium concentration is desirably at least 1% or greater.

Figure 22:
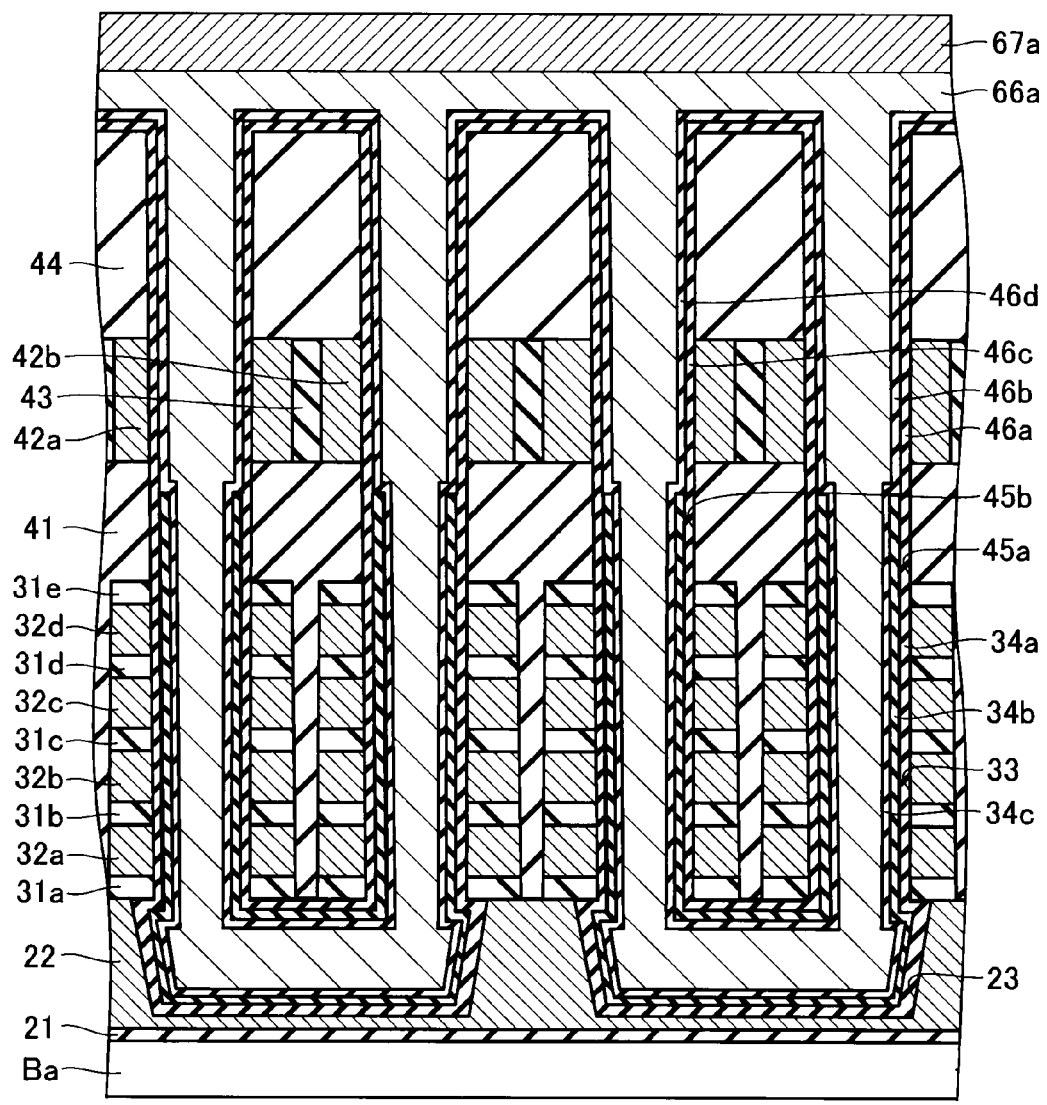
FIG. 22 is a cross-sectional view showing a manufacturing process of the nonvolatile semiconductor memory device 100 in accordance with the first embodiment.

Next, crystallization heat treatment is performed, as shown in FIG. 22. For example, crystallization annealing is performed under the following conditions, namely in $N_2$, at 530° C.-570° C., for 1 hour-24 hours. Now, for crystallization in the case of pure amorphous silicon not implanted with germanium, a heat treatment of 600° C. is necessary for generating a crystal nucleus that forms a starting point for crystallization. This enables the manufacturing process in accordance with the first embodiment to be performed easily, without requiring a high temperature heat treatment.

Under the conditions shown above, crystal nucleus generation speed in a pure silicon (Si) layer is sufficiently slow for, whereas nuclei is generated only in a silicon germanium (SiGe) layer. Once crystal nuclei are generated in the silicon germanium layer, solid phase growth of crystal grains based on the crystal nuclei is possible at this temperature even in the pure silicon layer. That is, growth of crystal grains proceeds from the upper layer 67 sequentially downward toward the amorphous silicon layer 66. On the other hand, in pure amorphous silicon in the case where germanium ions are not implanted, crystal nuclei are not easily generated at a temperature of under 570° C., and, conversely, at a temperature of 600° C. and above, crystal nuclei are generated with a uniform density throughout the whole of the film, leading to solid phase growth of crystal grains originating from the crystal nuclei. As a result, on the whole, a large number of crystals with small grain diameter are generated. As shown by the above, the crystal grains in the first embodiment are formed large compared to the case where germanium ions are not implanted. Through the process shown in FIG. 22, the layer 67 becomes a silicon germanium layer 67a, and the amorphous silicon layer 66 becomes a polysilicon layer 66a.

Figure 23:
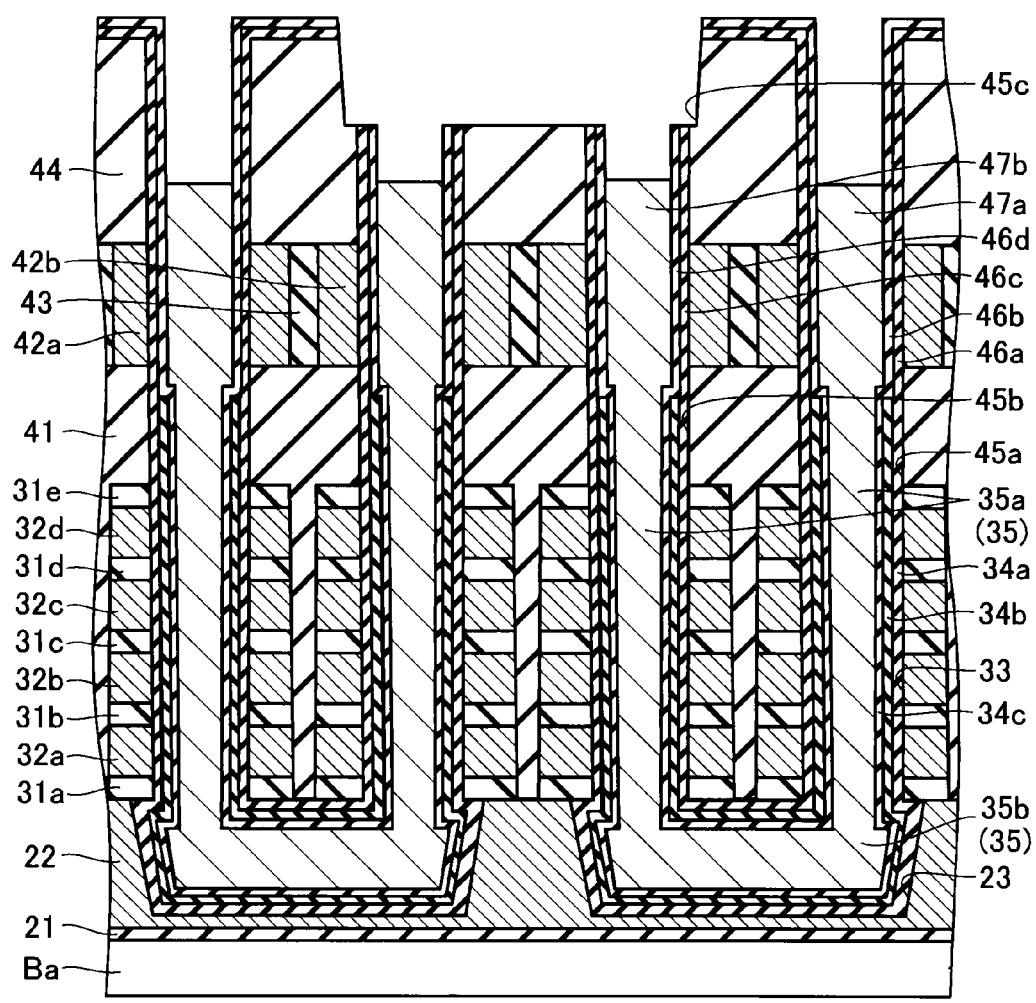
FIG. 23 is a cross-sectional view showing a manufacturing process of the nonvolatile semiconductor memory device 100 in accordance with the first embodiment.

Then, as shown in FIG. 23, RIE is used to remove the silicon germanium layer 67a. In addition, RIE is used to dig out the polysilicon layer 66a to a certain depth of the drain side holes 45a (source side holes 45b). Moreover, an upper portion of each of the source side holes 45b adjacent in the column direction is dug out so as to link up in the column direction, thereby forming the source line wiring trench 45c. The source line wiring trench 45c is formed having a rectangular shaped opening that is short in the column direction and long in the row direction. Through these processes, the polysilicon layer 66a becomes the U-shaped semiconductor layer 35, and the drain side columnar semiconductor layer 47a and source side columnar semiconductor layer 47b formed continuously in an integrated manner.

Next, tungsten (W)/titanium nitride (TiN)/titanium (Ti) are deposited so as to fill the drain side holes 45a, the source side holes 45b, and the source line wiring trench 45c, thereby forming the plug layers 48a and the source line conductive layer 48b. Then, the wiring layer 50 is formed, thereby completing formation of the nonvolatile semiconductor memory device 100 shown in FIG. 4.

(Advantages of the Nonvolatile Semiconductor Memory Device 100 in Accordance with the First Embodiment)

Next, advantages of the nonvolatile semiconductor memory device 100 in accordance with the first embodiment are described. The nonvolatile semiconductor memory device 100 in accordance with the first embodiment is capable of a high degree of integration as shown in the above-described stacking structure.

Furthermore, in the first embodiment, the U-shaped semiconductor layer 35 and the drain side columnar semiconductor layer 47a (source side columnar semiconductor layer 47b) are formed continuously in an integrated manner. Through such a configuration, a contact resistance between the U-shaped semiconductor layer 35 and the drain side columnar semiconductor layer 47a (source side columnar semiconductor layer 47b) can be curbed.

In addition, in the first embodiment, the U-shaped semiconductor layer 35 and the drain side columnar semiconductor layer 47a (source side columnar semiconductor layer 47b) are crystallized subsequent to having an upper surface implanted with germanium ions. As a result, the U-shaped semiconductor layer 35 and the drain side columnar semiconductor layer 47a (source side columnar semiconductor layer 47b) are configured by polysilicon with larger crystal grains than in the case where germanium ions are not implanted. A commonly-used method for increasing crystal grains by solid phase growth is to bring a portion of amorphous silicon into contact with a silicon substrate and polysilicon, and grow the crystal grains taking that point as a starting point. Conventionally, features of the manufacturing processes of the U-shaped semiconductor layer make it difficult to bring amorphous silicon into contact with previously formed polysilicon to improve reliability of the memory gate insulating layer and lower the contact resistance of the semiconductor layer in the case of forming the U-shaped semiconductor layer. In contrast, the nonvolatile semiconductor memory device in accordance with the first embodiment causes the crystal nuclei to be generated preferentially in a layer implanted with germanium ions, whereby reliability of the memory gate insulating layer can be improved and the contact resistance of the semiconductor layer lowered, while at the same time, crystal grains can be increased to improve the cell current and a speeding up of the memory can be realized.

[Second Embodiment]

(Configuration of a Nonvolatile Semiconductor Memory Device in Accordance with a Second Embodiment)

Figure 24:
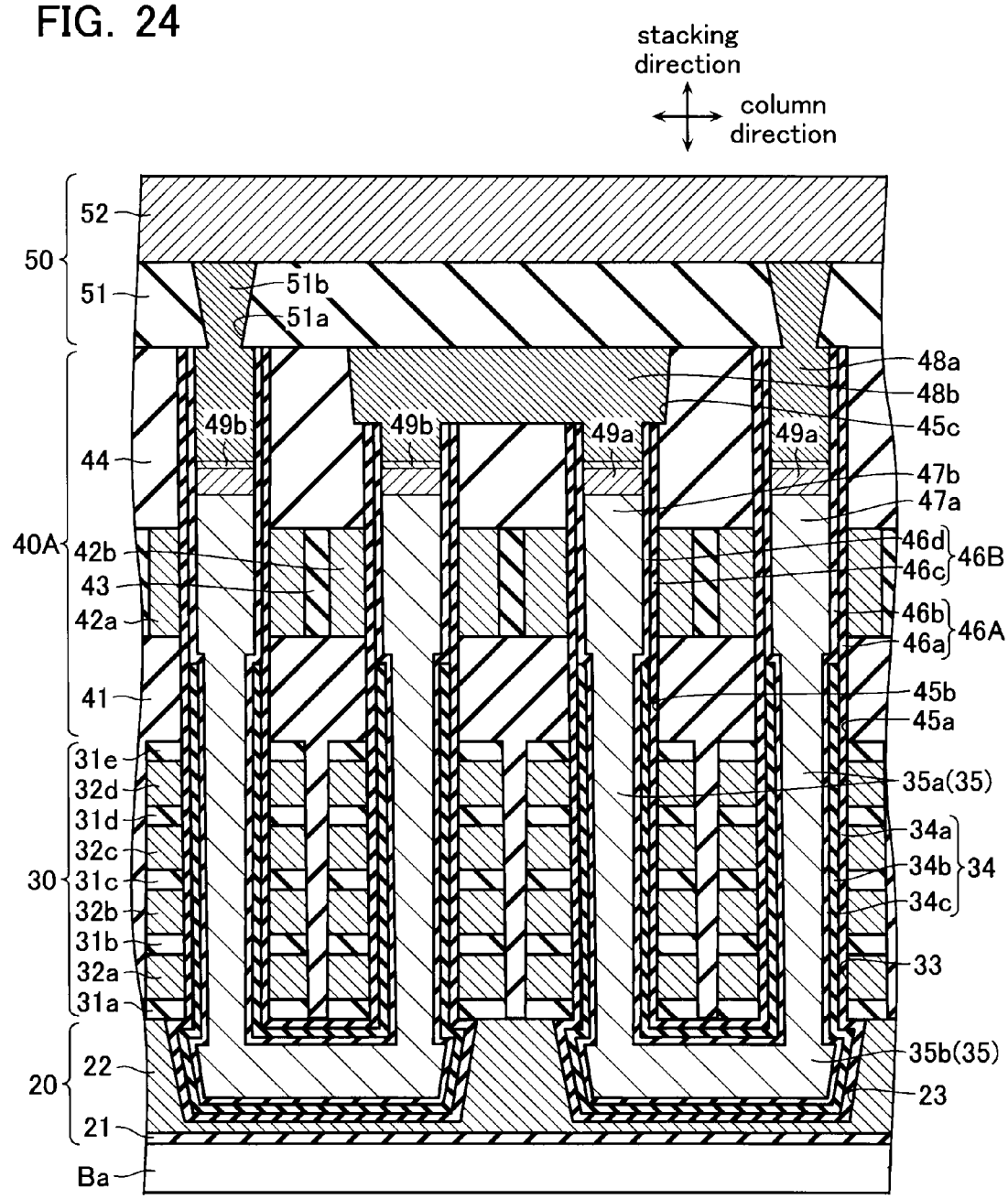
FIG. 24 is a cross-sectional view of a nonvolatile semiconductor memory device in accordance with a second embodiment of the present invention.

Next, a configuration of a nonvolatile semiconductor memory device in accordance with a second embodiment is described with reference to FIG. 24. FIG. 24 is a cross-sectional view of a memory transistor region of the nonvolatile semiconductor memory device in accordance with the second embodiment. Note that in the second embodiment, identical symbols are assigned to configurations similar to those in the first embodiment and descriptions thereof are omitted.

As shown in FIG. 24, the nonvolatile semiconductor memory device in accordance with the second embodiment includes a select transistor layer 40A which differs from that of the first embodiment.

The select transistor layer 40A further includes semiconductor layers 49a and 49b, in addition to the configurations of the first embodiment. The semiconductor layer 49a is formed on an upper surface of the drain side columnar semiconductor layer 47a and on an upper surface of the source side columnar semiconductor layer 47b. The semiconductor layer 49b is formed on an upper surface of the semiconductor layer 49a. The semiconductor layers 49a and 49b are positioned in a higher layer than the upper surface of the drain side conductive layer 42a (source side conductive layer 42b).

The semiconductor layer 49a is constituted by silicon germanium (SiGe). Germanium concentration in the semiconductor layer 49a is 1% or more and 20-30% or less. Here, the germanium concentration is set to be 20-30% or less in consideration of an increase in off leak current. The semiconductor layer 49b is constituted by titanium germanide (TiGe$_2$) and titanium silicide (TiSi$_2$).

(Method of Manufacturing the Nonvolatile Semiconductor Memory Device in Accordance with the Second Embodiment)

Figure 25:
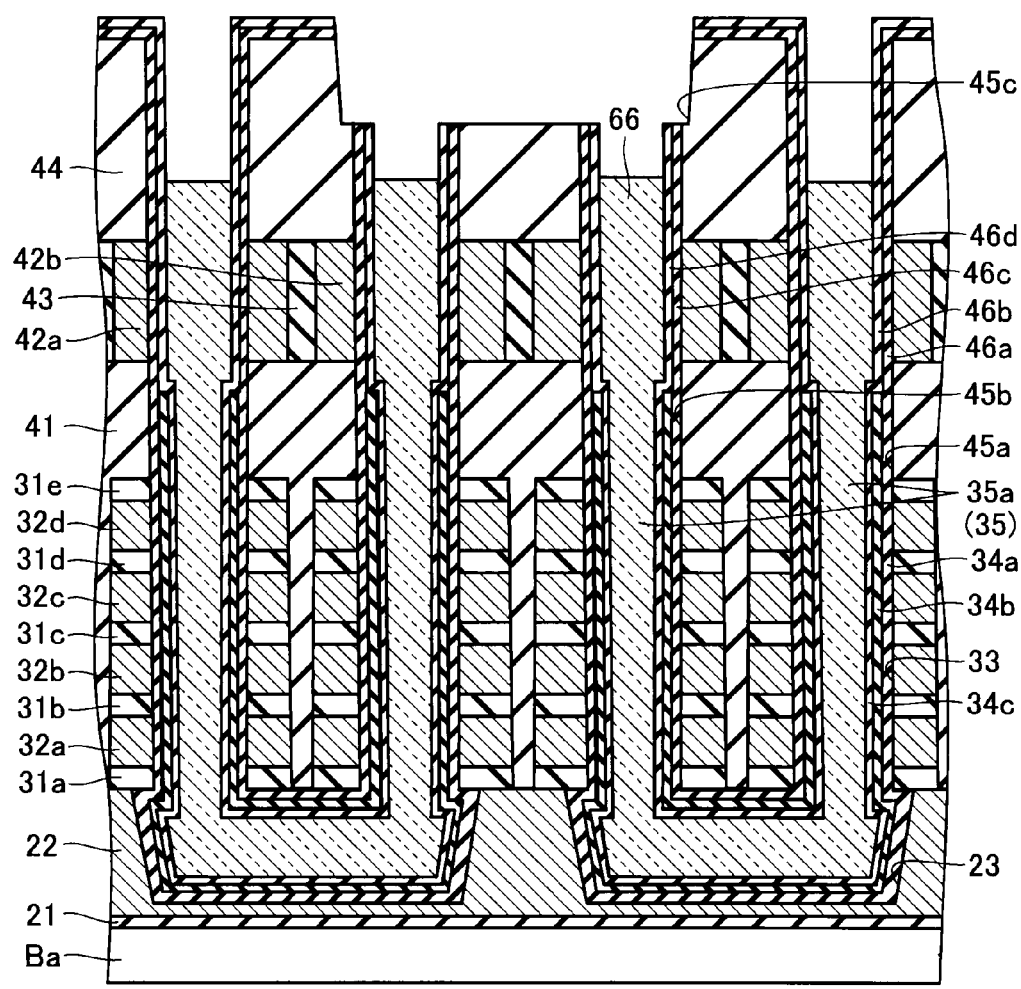
FIG. 25 is a cross-sectional view showing a manufacturing process of the nonvolatile semiconductor memory device in accordance with the second embodiment.
Figure 26:
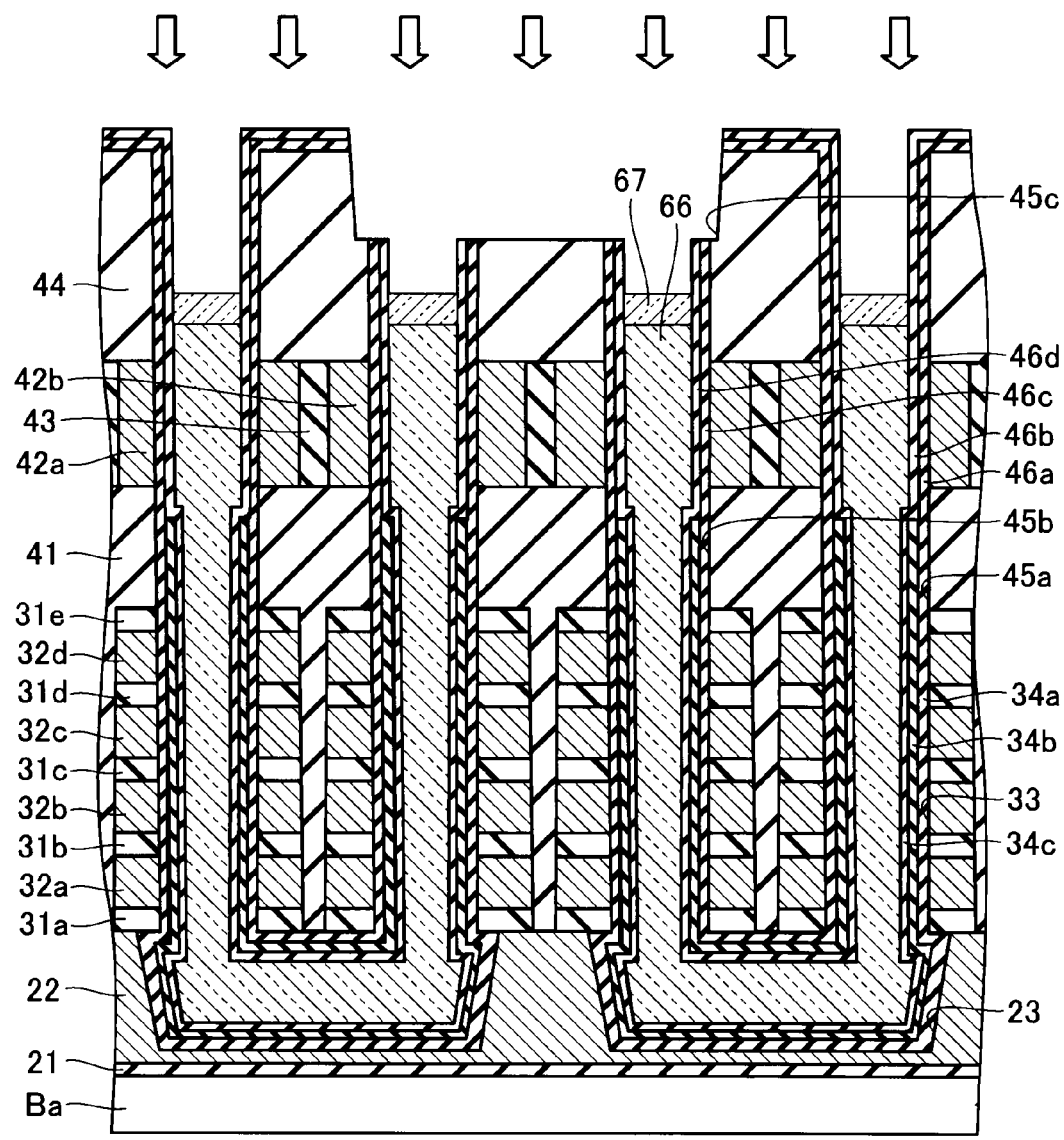
FIG. 26 is a cross-sectional view showing a manufacturing process of the nonvolatile semiconductor memory device in accordance with the second embodiment.
Figure 27:
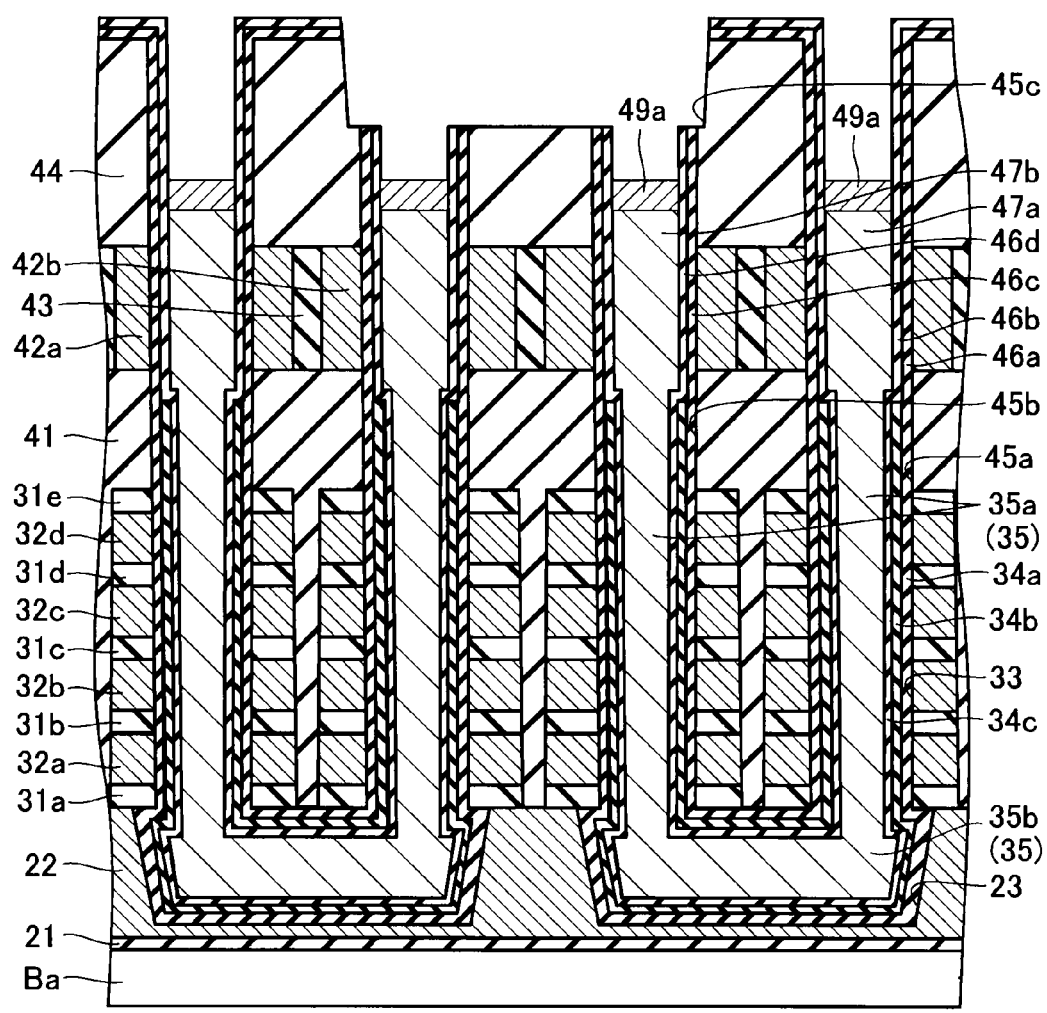
FIG. 27 is a cross-sectional view showing a manufacturing process of the nonvolatile semiconductor memory device in accordance with the second embodiment.

Next, a method of manufacturing the nonvolatile semiconductor memory device in accordance with the second embodiment is described with reference to FIGS. 25-27. FIGS. 25-27 are cross-sectional views showing a manufacturing process of the nonvolatile semiconductor memory device in accordance with the second embodiment.

First, processes similar to those in FIGS. 5-20 of the first embodiment are executed. Next, RIE is used to dig out the amorphous silicon layer 66 to a certain depth of the drain side holes 45a (source side holes 45b), as shown in FIG. 25. In addition, an upper portion of each of the source side holes 45b adjacent in the column direction is dug out so as to link up in the column direction, thereby forming the source line wiring trench 45c.

Then, germanium (Ge) ions are implanted into an upper surface of the amorphous silicon layer 66, as shown in FIG. 26. Through this process, a layer 67 implanted with germanium ions is formed in the upper surface of the amorphous silicon layer 66.

Next, crystallization heat treatment is performed, as shown in FIG. 27. At this time, crystal growth proceeds from the upper layer 67 sequentially downward toward the amorphous silicon layer 66. As a result, the crystal grains are formed large compared to the case where germanium ions are not implanted. Through the process shown in FIG. 27, the layer 67 becomes the semiconductor layer 49a constituted by silicon germanium. In addition, the amorphous silicon layer 66 becomes the U-shaped semiconductor layer 35, and the drain side columnar semiconductor layer 47a and source side columnar semiconductor layer 47b constituted by polysilicon and formed continuously in an integrated manner.

Then, tungsten (W)/titanium nitride (TiN)/titanium (Ti) are deposited so as to fill the drain side holes 45a, the source side holes 45b, and the source line wiring trench 45c, thereby forming the plug layers 48a and the source line conductive layer 48b, similarly to the first embodiment. At this time, the semiconductor layer 49b constituted by titanium germanide (TiGe$_2$) and titanium silicide (TiSi$_2$) is formed at an interface of the plug layers 48a and the semiconductor layer 49a and at an interface of the source line conductive layer 48b and the semiconductor layer 49a. Then, the wiring layer 50 is formed, thereby completing formation of the nonvolatile semiconductor memory device in accordance with the second embodiment shown in FIG. 24.

(Advantages of the Nonvolatile Semiconductor Memory Device in Accordance with the Second Embodiment)

Next, advantages of the nonvolatile semiconductor memory device in accordance with the second embodiment are described. The nonvolatile semiconductor memory device in accordance with the second embodiment is manufactured by processes substantially similar to those of the first embodiment and thus displays similar advantages to those of the first embodiment.

In addition, the nonvolatile semiconductor memory device in accordance with the second embodiment includes the semiconductor layer 49b constituted by titanium germanide (TiGe$_2$) and titanium silicide (TiSi$_2$). Now, titanium (Ti) reacts with germanium (Ge) at a lower temperature than silicon (Si) to form a silicide. Consequently, the semiconductor layer 49b enables a contact between the plug layers 48a and the semiconductor layer 49a and a contact between the source line conductive layer 48b and the semiconductor layer 49a in the nonvolatile semiconductor memory device in accordance with the second embodiment to be formed at a lower temperature than in the first embodiment. That is, in the nonvolatile semiconductor memory device in accordance with the second embodiment, it is possible to curb thermal stress during manufacture (wiring process) more than in the first embodiment, thereby enabling achievement of a high reliability.

[Third Embodiment]

(Configuration of a Nonvolatile Semiconductor Memory Device in Accordance with a Third Embodiment)

Figure 28:
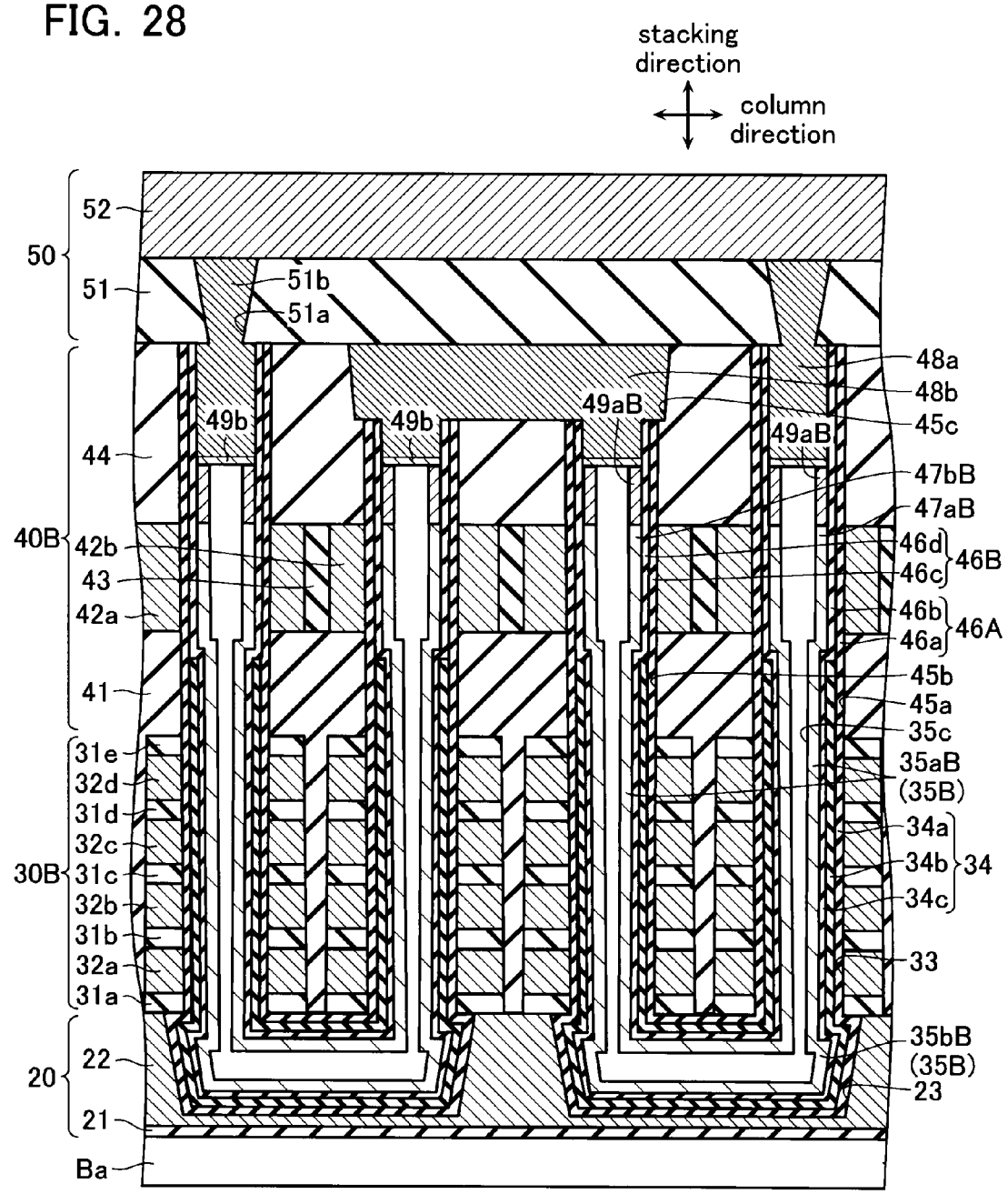
FIG. 28 is a cross-sectional view of a nonvolatile semiconductor memory device in accordance with a third embodiment of the present invention.

Next, a configuration of a nonvolatile semiconductor memory device in accordance with a third embodiment is described with reference to FIG. 28. FIG. 28 is a cross-sectional view showing the configuration of the nonvolatile semiconductor memory device in accordance with the third embodiment.

As shown in FIG. 28, the nonvolatile semiconductor memory device in accordance with the third embodiment includes a memory transistor layer 30B and a select transistor layer 40B which differ from those of the first and second embodiments.

The memory transistor layer 30B includes a U-shaped semiconductor layer 35B (columnar portion 35aB and connecting portion 35bB) which differs from those of the first and second embodiments. The select transistor layer 40B includes a drain side columnar semiconductor layer 47aB, a source side columnar semiconductor layer 47bB, and a semiconductor layer 49aB which differ from those of the first and second embodiments.

Included inside the U-shaped semiconductor layer 35B, the drain side columnar semiconductor layer 47aB, the source side columnar semiconductor layer 47bB, and the semiconductor layer 49aB is a continuous hollow 35c.

(Method of Manufacturing the Nonvolatile Semiconductor Memory Device in Accordance with the Third Embodiment)

Figure 29:
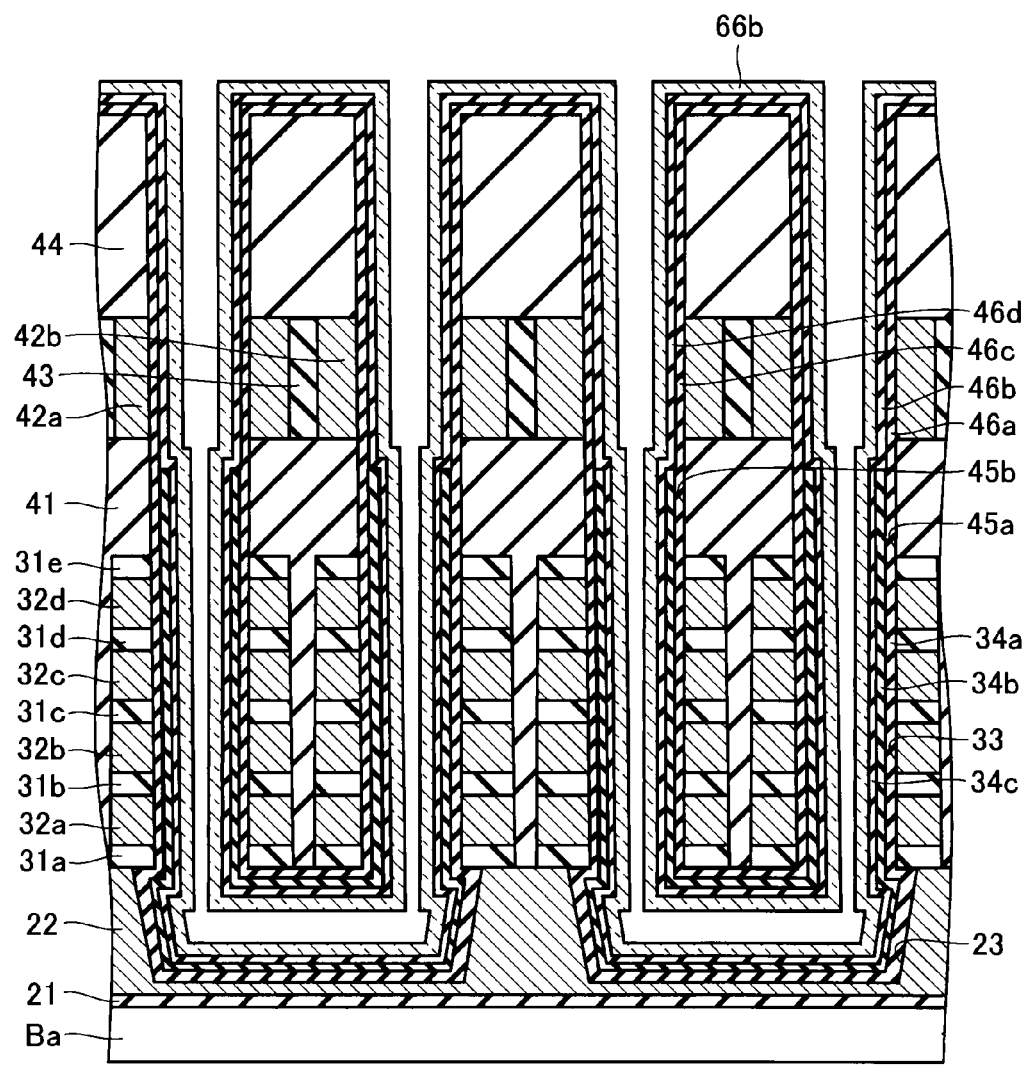
FIG. 29 is a cross-sectional view showing a manufacturing process of the nonvolatile semiconductor memory device in accordance with the third embodiment.
Figure 30:
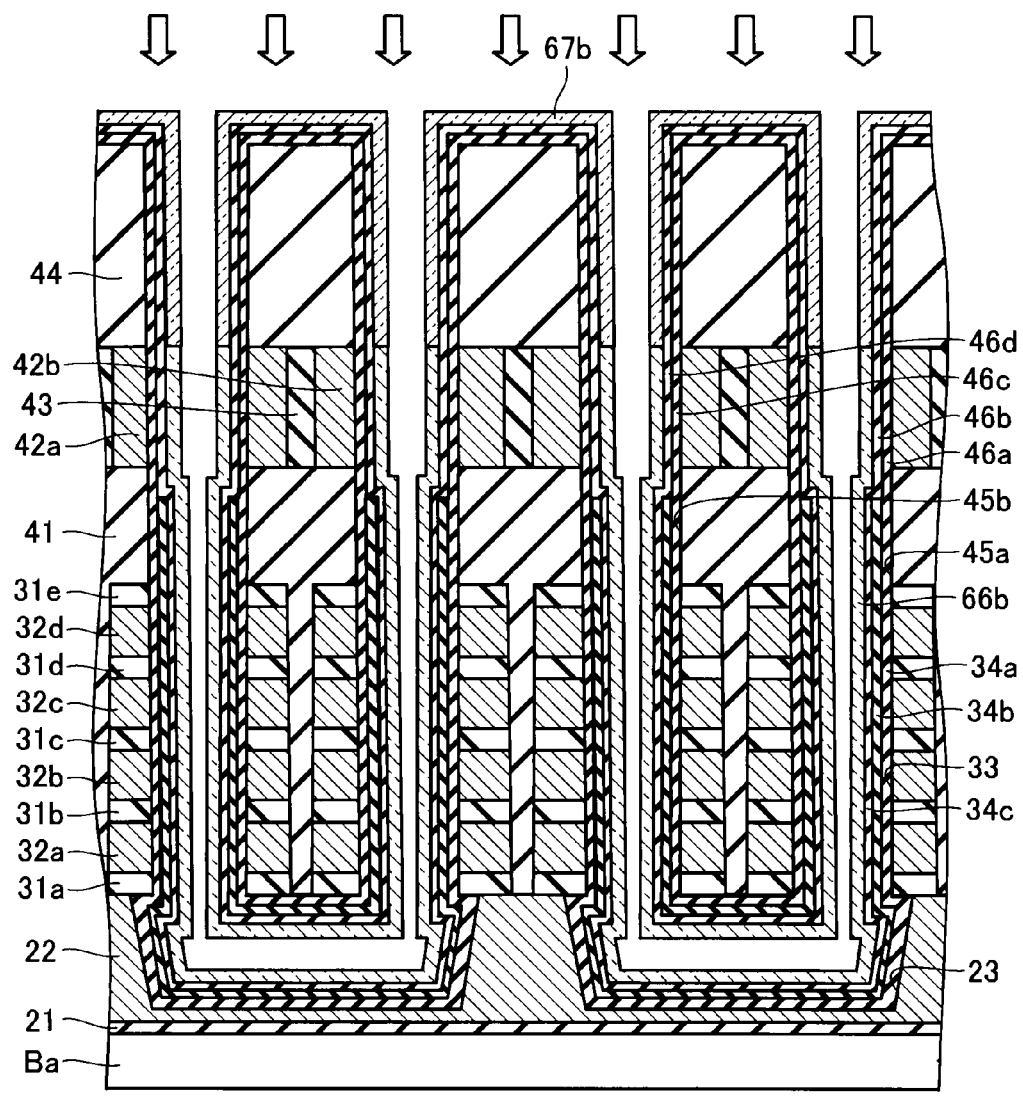
FIG. 30 is a cross-sectional view showing a manufacturing process of the nonvolatile semiconductor memory device in accordance with the third embodiment.
Figure 31:
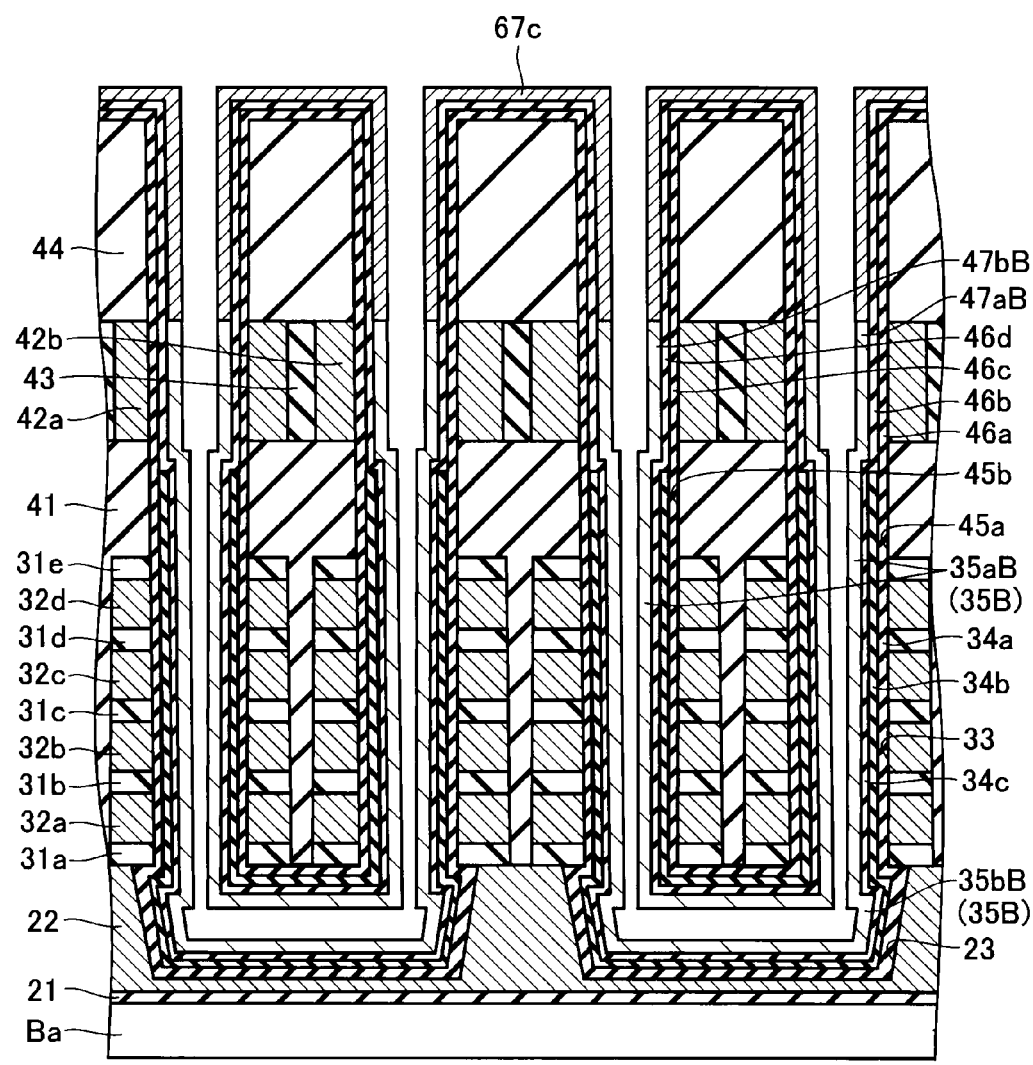
FIG. 31 is a cross-sectional view showing a manufacturing process of the nonvolatile semiconductor memory device in accordance with the third embodiment.

Next, a method of manufacturing the nonvolatile semiconductor memory device in accordance with the third embodiment is described with reference to FIGS. 29-31. FIGS. 29-31 are cross-sectional views showing a manufacturing process of the nonvolatile semiconductor memory device in accordance with the third embodiment.

First, processes up to those shown in FIGS. 5-19 of the first embodiment are executed. Then, silicon oxide (SiO$_2$) and amorphous silicon (a-Si) are deposited inside the back gate holes 23, the memory holes 33, the drain side holes 45a, and the source side holes 45b, as shown in FIG. 29. Note that, at this time, the amorphous silicon (a-Si) is deposited so as not to completely fill the back gate holes 23, the memory holes 33, the drain side holes 45a, and the source side holes 45b, thereby forming an amorphous silicon layer 66b.

Next, germanium (Ge) ions are implanted from above the amorphous silicon layer 66b so as to be incident obliquely, as shown in FIG. 30. Through this process, a layer 67b implanted with germanium ions is formed in an upper surface of the amorphous silicon layer 66b.

Then, crystallization heat treatment is performed, as shown in FIG. 31. At this time, crystal growth proceeds from the upper layer 67b sequentially downward toward the amorphous silicon layer 66b. As a result, the crystal grains are formed large compared to the case where germanium ions are not implanted. Through the process shown in FIG. 31, the layer 67b becomes a silicon germanium layer 67c. In addition, the amorphous silicon layer 66b becomes the U-shaped semiconductor layer 35B, and the drain side columnar semiconductor layer 47aB and source side columnar semiconductor layer 47bB constituted by polysilicon and formed continuously in an integrated manner.

Then, manufacturing processes similar to those of the first embodiment are performed to complete manufacture of the nonvolatile semiconductor memory device in accordance with the third embodiment.

(Advantages of the Nonvolatile Semiconductor Memory Device in Accordance with the Third Embodiment)

Next, advantages of the nonvolatile semiconductor memory device in accordance with the third embodiment are described. The nonvolatile semiconductor memory device in accordance with the third embodiment is manufactured by processes substantially similar to those of the first embodiment and thus displays similar advantages to those of the first embodiment.

In addition, the nonvolatile semiconductor memory device in accordance with the third embodiment is formed by utilizing the hollow 35c to perform obliquely incident ion implantation. That is, energy of the ion implantation is lower than in the first and second embodiments. As a result, in the third embodiment, time required for the ion implantation can be considerably reduced and manufacturing costs kept low.

Moreover, in the nonvolatile semiconductor memory device in accordance with the third embodiment, the U-shaped semiconductor layer 35B, the drain side columnar semiconductor layer 47aB, the source side columnar semiconductor layer 47bB, and the semiconductor layer 49aB are formed to include the hollow 35c. This configuration enables an electric field intensity at a channel surface of the U-shaped semiconductor layer 35B, the drain side columnar semiconductor layer 47aB, the source side columnar semiconductor layer 47bB, and the semiconductor layer 49aB to be strengthened more than in the first and second embodiments. Consequently, in the nonvolatile semiconductor memory device in accordance with the third embodiment, more carriers can be induced than in the first embodiment when the same voltage is used, whereby cell current can be improved and operation stabilized.

Furthermore, the hollow 35c makes it possible to form the U-shaped semiconductor layer 35B having a constant thickness, irrespective of a diameter of the back gate hole 23 and the memory hole 33. Moreover, the hollow 35c makes it possible to form the drain side columnar semiconductor layer 47aB and the source side columnar semiconductor layer 47bB having a constant thickness, irrespective of a diameter of the drain side hole 45a and the source side hole 45b. That is, characteristics of the memory transistors MTr1-MTr8, the drain side select transistors SDTr, and the source side select transistors SSTr in the nonvolatile semiconductor memory device in accordance with the third embodiment can be maintained, irrespective of variations in opening diameter during manufacture.

[Fourth Embodiment]

(Configuration of a Nonvolatile Semiconductor Memory Device in Accordance with a Fourth Embodiment)

Figure 32:
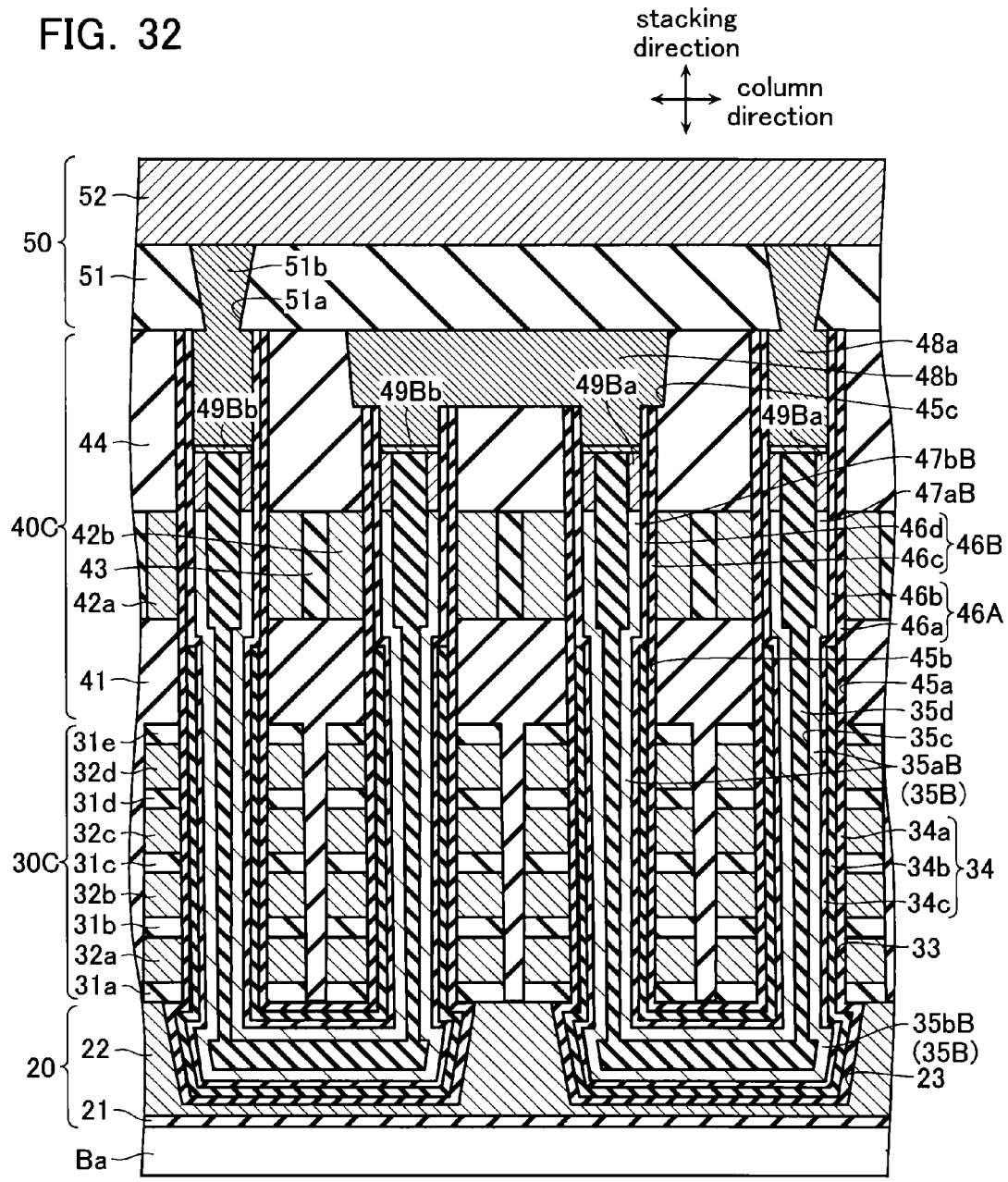
FIG. 32 is a cross-sectional view of a nonvolatile semiconductor memory device in accordance with a fourth embodiment of the present invention.

Next, a configuration of a nonvolatile semiconductor memory device in accordance with a fourth embodiment is described with reference to FIG. 32. FIG. 32 is a cross-sectional view of a memory transistor region of the nonvolatile semiconductor memory device in accordance with the fourth embodiment. Note that in the fourth embodiment, identical symbols are assigned to configurations similar to those in the first through third embodiments and descriptions thereof are omitted.

As shown in FIG. 32, the nonvolatile semiconductor memory device in accordance with the fourth embodiment includes a memory transistor layer 30C and a select transistor layer 40C which differ from those of the first and second embodiments.

The memory transistor layer 30C and the select transistor layer 40C include an internal insulating layer 35d in addition to the configurations of the third embodiment. The internal insulating layer 35d is formed so as to fill the hollow 35c. The internal insulating layer 35d is constituted by silicon oxide ($SiO_2$).

The nonvolatile semiconductor memory device in accordance with the fourth embodiment is formed by further depositing silicon oxide ($SiO_2$) on an upper layer of the U-shaped semiconductor layer 35B, the drain side columnar semiconductor layer 47aB, the source side columnar semiconductor layer 47bB, and the layer 67c subsequent to the process shown in FIG. 31 in accordance with the third embodiment.

(Advantages of the Nonvolatile Semiconductor Memory Device in Accordance with the Fourth Embodiment)

Next, advantages of the nonvolatile semiconductor memory device in accordance with the fourth embodiment are described. The nonvolatile semiconductor memory device in accordance with the fourth embodiment is manufactured by processes substantially similar to those of the third embodiment and thus displays similar advantages to those of the third embodiment.

[Other Embodiments]

This concludes description of embodiments of the nonvolatile semiconductor memory device in accordance with the present invention, but it should be noted that the present invention is not limited to the above-described embodiments, and that various alterations, additions, substitutions, and so on, are possible within a range not departing from the scope and spirit of the invention. For example, the nonvolatile semiconductor memory device in accordance with the present invention may be a first variant example and a second variant example shown below.

FIRST VARIANT EXAMPLE

The first variant example is described. In the first variant example, the layer 67 is formed by implanting the germanium ions with a higher energy thereby causing a concentration gradient to be provided to a deeper portion in the process shown in FIG. 21 of the first embodiment (or the process shown in FIG. 26 of the second embodiment). The layer 67 is configured to be $Si_{1-x}Ge_x$ ("x" is large in an upper portion of layer compared with other portions of the layer 67 and becomes smaller with increasing downward distance).

In the first variant example, since a gradient is given also to solid phase growth speed, it becomes possible for sequential crystallization to proceed from an upper portion even more reliably than in the first through fourth embodiments, whereby yield can be improved.

SECOND VARIANT EXAMPLE

The second variant example is described. In the second variant example, a heat treatment temperature is raised gradually from 550° C. or less to 600° C. in the crystallization process, in addition to the above-described method of manufacturing according to the first variant example.

In the second variant example, large crystal grains can be grown from above while reducing heat treatment time, whereby a rise in costs of the manufacturing processes can be curbed.

What is claimed is:

1. A nonvolatile semiconductor memory device, comprising:
    a plurality of memory strings each having a plurality of electrically rewritable memory cells connected in series; and
    select transistors each connected to one of the ends of the memory strings,
    each of the memory strings comprising:
    a first semiconductor layer having a plurality of columnar portions extending in a perpendicular direction with respect to a substrate, and joining portions joining lower ends of the plurality of columnar portions;
    a charge storage layer surrounding a side surface of the first semiconductor layer; and
    a first conductive layer surrounding a side surface of the charge storage layer and functioning as a control electrode of the memory cells, and
    each of the select transistors comprising:
    a second semiconductor layer extending upwardly from an upper surface of the columnar portions;
    an insulating layer surrounding a side surface of the second semiconductor layer;
    a second conductive layer surrounding a side surface of the insulating layer and functioning as a control electrode of the select transistors; and
    a third semiconductor layer formed on an upper surface of the second semiconductor layer and including silicon germanium.

2. The nonvolatile semiconductor memory device according to claim 1,
    wherein the third semiconductor layer is positioned in a higher layer than an upper surface of the second conductive layer.

3. The nonvolatile semiconductor memory device according to claim 1,
    wherein the first through third semiconductor layers include a hollow therein.

4. The nonvolatile semiconductor memory device according to claim 3,
    wherein each of the memory strings and each of the select transistors further comprises an internal insulating layer formed so as to fill the hollow.

5. The nonvolatile semiconductor memory device according to claim 1,
    wherein each of the select transistors further comprises a fourth semiconductor layer formed on an upper surface of the third semiconductor layer and including titanium germanide.

6. The nonvolatile semiconductor memory device according to claim 1,
    wherein a concentration of germanium is large in an upper portion of the third semiconductor layer compared with other portions of the third semiconductor layer, and becomes smaller with increasing downward distance in the third semiconductor layer.

7. The nonvolatile semiconductor memory device according to claim 1,
    wherein each of the memory strings comprises:
    a tunnel insulating layer provided between the first semiconductor layer and the charge storage layer; and
    a block insulating layer provided between the charge storage layer and the first conductive layer, and
    wherein the insulating layer comprises:
    a first insulating layer formed continuously in an integrated manner with the tunnel insulating layer; and
    a second insulating layer formed continuously in an integrated manner with the block insulating layer.

8. A nonvolatile semiconductor memory device, comprising:
    a plurality of memory strings each having a plurality of electrically rewritable memory cells connected in series; and
    select transistors each connected to one of the ends of the memory strings,
    each of the select transistors comprising:
    a second semiconductor layer extending upwardly;
    an insulating layer surrounding a side surface of the second semiconductor layer;
    a second conductive layer surrounding a side surface of the insulating layer and functioning as a control electrode of the select transistors; and
    a third semiconductor layer formed on an upper surface of the second semiconductor layer and including silicon germanium,
    the third semiconductor layer being positioned in a higher layer than an upper surface of the second conductive layer.

9. The nonvolatile semiconductor memory device according to claim 8,
    wherein the second semiconductor layer and the third semiconductor layer include a hollow therein.

10. The nonvolatile semiconductor memory device according to claim 9,
    wherein each of the select transistors further comprises an internal insulating layer formed so as to fill the hollow.

11. The nonvolatile semiconductor memory device according to claim 8,
    wherein each of the select transistors further comprises a fourth semiconductor layer formed on an upper surface of the third semiconductor layer and including titanium germanide.

12. The nonvolatile semiconductor memory device according to claim 8,
    wherein a concentration of germanium is large in an upper portion of the third semiconductor layer compared with other portions of the third semiconductor layer, and becomes smaller with increasing downward distance in the third semiconductor layer.

* * * * *